(12) United States Patent
Lam et al.

(10) Patent No.: US 11,201,723 B1
(45) Date of Patent: Dec. 14, 2021

(54) HIGHLY LINEAR PHASE ROTATORS WITH CONTINUOUS ROTATION

(71) Applicant: Ciena Corporation, Hanover, MD (US)

(72) Inventors: Jerry Yee-Tung Lam, Stittsville (CA); Sadok Aouini, Gatineau (CA); Naim Ben-Hamida, Nepean (CA)

(73) Assignee: Ciena Corporation, Hanover, MD (US)

( * ) Notice: Subject to any disclaimer, the term of this patent is extended or adjusted under 35 U.S.C. 154(b) by 0 days.

(21) Appl. No.: 17/013,946

(22) Filed: Sep. 8, 2020

(51) Int. Cl.
*H04L 27/28* (2006.01)
*H04L 5/12* (2006.01)
*H04L 7/033* (2006.01)
*H03L 7/081* (2006.01)
*G06F 1/08* (2006.01)

(52) U.S. Cl.
CPC .......... *H04L 7/0337* (2013.01); *H03L 7/0814* (2013.01); *G06F 1/08* (2013.01)

(58) Field of Classification Search
CPC ....... H04L 7/0337; H03L 7/0814; G06F 1/08; H03C 3/40
USPC ....... 375/219, 220, 222, 261, 279, 298, 308, 375/329
See application file for complete search history.

(56) References Cited

U.S. PATENT DOCUMENTS 6,307,894 B2 * 10/2001 Eidson ..................... H03C 3/40
375/297

* cited by examiner

*Primary Examiner* — Phuong Phu
(74) *Attorney, Agent, or Firm* — Young Basile Hanlon & MacFarlane, P.C.

(57) ABSTRACT

Described herein are apparatus and methods for highly linear phase rotators with continuous rotation. A method includes generating a first code and a second code based on a desired offset to match a first and second frequency, respectively, calibrating the first code and the second code based on first phase rotator characteristics and second phase rotator characteristics, respectively, generating first N phase offset codes and second N phase offset codes from a calibrated first and second code, respectively, wherein each phase offset code constrains functionality of the first phase rotator and the second phase rotator, respectively, associated with a phase of the input clock to a defined region of operation, rotating a clock using the first N phase offset codes and the second N phase offset codes to match the first and second frequency, respectively.

19 Claims, 17 Drawing Sheets ary circuits. For example, conventional clock generation circuitry uses two clock generation circuits to track a receiver clock for a receiver-transmitter pair implementing a first channel and a transmitter clock for a transmitter-receiver pair implementing a second channel. The clock generation circuitry can be complex, the performance poor, and the power consumption high.

HIGHLY LINEAR PHASE ROTATORS WITH CONTINUOUS ROTATION

TECHNICAL FIELD

This disclosure relates to clock generation circuits. More specifically, this disclosure relates to phase rotators.

BACKGROUND

The need for higher frequency clocks in optical transceivers grows as the data rate in optical coherent modems increases. However, the capacity of semiconductor technologies optimized for high-speed digital signal processing and data processing is lacking. For example, conventional clock generation circuitry uses two clock generation circuits to track a receiver clock for a receiver-transmitter pair implementing a first channel and a transmitter clock for a transmitter-receiver pair implementing a second channel. The clock generation circuitry can be complex, the performance poor, and the power consumption high.

SUMMARY

Described herein are apparatus and methods for highly linear phase rotators with continuous rotation.

In implementations, a clock generation circuit includes a single phase locked loop configured to generate a clock, a receiver clock generation circuit connected to the phase locked loop, the receiver clock generation circuit comprises a receiver phase rotator having N phase segments corresponding to N phases of the clock, a receiver code generation circuit configured to apply receiver phase rotator calibration corrections to a receiver master code associated with a determined frequency offset and generate N receiver phase offset codes from the receiver master code, wherein each receiver phase offset code constrains receiver phase rotator functionality associated with a phase segment to a defined region of operation, and the receiver phase rotator configured to rotate the clock using the N receiver phase offset codes to output a receiver clock which matches a receiver channel frequency, and a transmitter clock generation circuit connected to the phase locked loop, the transmitter clock generation circuit comprises a transmitter phase rotator having N phase segments corresponding to N phases of the clock, a transmitter code generation circuit configured to apply transmitter phase rotator calibration corrections to a transmitter master code associated with a determined frequency offset and generate N transmitter phase offset codes from the transmitter master code, wherein each transmitter phase offset code constrains transmitter phase rotator functionality associated with a phase segment to a defined region of operation, and the transmitter phase rotator configured to rotate the clock using the N transmitter phase offset codes to output a transmitter clock which matches a transmitter channel frequency.

In implementations, each of the receiver phase rotator and the transmitter phase rotator are configured to provide continuous rotation of the clock to track the receiver channel frequency and the transmitter channel frequency, respectively. In implementations, each phase segment of the receiver phase rotator and each phase segment the transmitter phase rotator further comprise a differential pair, wherein N receiver differential pairs link the N phases of the clock to the receiver clock and wherein N transmitter differential pairs link the N phases of the clock to the transmitter clock. In implementations, each phase segment of the receiver phase rotator has a receiver differential pair which is connected to an associated non-differential current source and each phase segment of the transmitter phase rotator has a transmitter differential pair which is connected to an associated non-differential current source. In implementations, each of the receiver phase rotator calibration corrections and the transmitter phase rotator calibration corrections correct inherent phase rotator non-linearity, phase mismatch between the N phases, gain mismatch between the N phases, path mismatches between phase pairs, and path mismatches at a receiver clock output or a transmitter clock output, respectively. In implementations, the receiver phase rotator and the transmitter phase rotator each comprise a current digital-to-analog (DAC) configured to provide a bias current compensated by the receiver code generation circuit, a two level current mirror connected to the current DAC, a differential pair connected to the two level current mirror via a resistive degeneration circuit and having gates connected to a phase pair, and a cascode stage connected to an output of the differential pair. In implementations, the receiver code generation circuit and the transmitter code generation circuit each compensate for arctan effect of a theoretically perfect differential pair and differential pair non-linearities. In implementations, the receiver code generation circuit and the transmitter code generation circuit each maintain each of the N phase segments of the receiver phase rotator and the transmitter phase rotator, respectively, with a minimum current to smooth segment transition boundaries. In implementations, each of the receiver code generation circuit and the transmitter code generation circuit comprise a first code circuit configured to apply one set of differential pair parameters based on most significant bits and least significant bits of a master code, a second code circuit configured to apply another set of differential pair parameters based on the most significant bits and the least significant bits of the master code, and N multiplexors connected to the first code circuit and the second code circuit, the N multiplexors configured to output N phase offset codes. In implementations, each of the receiver code generation circuit and the transmitter code generation circuit comprise a look-up table to apply receiver phase rotator calibration corrections and transmitter phase rotator calibration corrections, respectively.

In implementations, a method for generating clocks includes generating a first master code based on a desired frequency offset to match a first channel frequency, generating a second master code based on a desired frequency offset to match a second channel frequency, calibrating the first master code based on characteristics of a first phase rotator to generate a calibrated first master code, calibrating the second master code based on characteristics of a second phase rotator to generate a calibrated second master code, generating first N phase offset codes from the calibrated first master code, wherein each phase offset code constrains functionality of the first phase rotator associated with a phase of the input clock to a defined region of operation, generating second N phase offset codes from the calibrated second master code, wherein each phase offset code constrains functionality of the second phase rotator associated with a phase of the input clock to a defined region of operation, rotating an input clock using the first N phase offset codes to match the first channel frequency, and rotating an input clock using the second N phase offset codes to match the second channel frequency.

In implementations, each of the first phase rotator and the second phase rotator are configured to provide continuous rotation of the input clock to track the first channel frequency and the second channel frequency, respectively. In implementations, the calibrating the first master code and the calibrating the second master code each further comprise using a look-up table to correct inherent phase rotator non-linearity, phase mismatch between the N phases, gain mismatch between the N phases, path mismatches between phase pairs, and path mismatches at an output. In implementations, the generating first N phase offset codes and the generating second N phase offset codes each compensate for arctan effects of a theoretically perfect differential pair and differential pair non-linearities. In implementations, the generating first N phase offset codes further comprises maintaining the first phase rotator associated with a phase of the input clock at a minimum current to smooth transition between phase boundaries and wherein the generating second N phase offset codes further comprises maintaining the second phase rotator associated with a phase of the input clock at a minimum current to smooth transition between phase boundaries. In implementations, the generating first N phase offset codes further comprises applying one set of differential pair parameters based on most significant bits and least significant bits of the first master code to generate a first first output, applying another set of differential pair parameters based on the most significant bits and the least significant bits of the first master code to generate a first second output, and outputting the first N phase offset codes by multiplexing the first output and the second output, and wherein the generating second N phase offset codes further comprises applying one set of differential pair parameters based on most significant bits and least significant bits of the second master code to generate a second first output, applying another set of differential pair parameters based on the most significant bits and the least significant bits of the second master code to generate a second second output, and outputting the first N phase offset codes by multiplexing the second first output and the second second output.

In implementations, a phase rotator includes N input clock phase segments, each input clock phase segment including a current digital-to-analog (DAC) configured to provide a bias current based on a phase offset code compensated for non-linearities associated with the respective input clock phase segment, a two level current mirror connected to the current DAC, a differential pair connected to the two level current mirror via a resistive degeneration circuit and having gates connected to a phase pair of an input clock, and a cascode stage connected to an output of the differential pair.

In implementations, the phase rotator provides continuous rotation of the input clock to track a channel frequency. In implementations, each phase offset code constrains functionality of a respective differential pair to a defined region of operation. In implementations, each phase offset code compensates for arctan effect of a theoretically perfect differential pair and differential pair non-linearities with respect to the input clock phase segment.

In implementations, a clock generation circuit includes a single phase locked loop configured to generate a clock, a receiver clock generation circuit connected to the phase locked loop, the receiver clock generation circuit comprises a receiver phase rotator having N phase segments with N receiver phase offset codes corresponding to N phases of the clock, the receiver phase rotator configured to rotate the clock using the N receiver phase offset codes to output a receiver clock which matches a receiver channel frequency, and a transmitter clock generation circuit connected to the phase locked loop, the transmitter clock generation circuit comprises a transmitter phase rotator having N phase segments with N transmitter phase offset codes corresponding to N phases of the clock, the transmitter phase rotator configured to rotate the clock using the N transmitter phase offset codes to output a transmitter clock which matches a transmitter channel frequency, wherein each of the receiver phase rotator and the transmitter phase rotator are configured to provide continuous rotation of the clock to track the receiver channel frequency and the transmitter channel frequency, respectively.

In implementations, each phase segment of the receiver phase rotator and each phase segment the transmitter phase rotator further comprise a differential pair, wherein N receiver differential pairs link the N phases of the clock to the receiver clock and wherein N transmitter differential pairs link the N phases of the clock to the transmitter clock. In implementations, each phase segment of the receiver phase rotator has a receiver differential pair which is connected to an associated non-differential current source and each phase segment of the transmitter phase rotator has a transmitter differential pair which is connected to an associated non-differential current source. In implementations, the clock generation circuit further includes a receiver code generation circuit configured to apply receiver phase rotator calibration corrections to a receiver master code associated with a determined frequency offset and generate the N receiver phase offset codes from the receiver master code, wherein each receiver phase offset code constrains receiver phase rotator functionality associated with a phase segment to a defined region of operation, and a transmitter code generation circuit configured to apply transmitter phase rotator calibration corrections to a transmitter master code associated with a determined frequency offset and generate the N transmitter phase offset codes from the transmitter master code, wherein each transmitter phase offset code constrains transmitter phase rotator functionality associated with a phase segment to a defined region of operation. In implementations, each of the receiver phase rotator calibration corrections and the transmitter phase rotator calibration corrections correct inherent phase rotator non-linearity, phase mismatch between the N phases, gain mismatch between the N phases, path mismatches between phase pairs, and path mismatches at a receiver clock output or a transmitter clock output, respectively. In implementations, the receiver phase rotator and the transmitter phase rotator each include a current digital-to-analog (DAC) configured to provide a bias current compensated by the receiver code generation circuit, a two level current mirror connected to the current DAC, a differential pair connected to the two level current mirror via a resistive degeneration circuit and having gates connected to a phase pair, and a cascode stage connected to an output of the differential pair. In implementations, the receiver code generation circuit and the transmitter code generation circuit each compensate for arctan effect of a theoretically perfect differential pair and differential pair non-linearities. In implementations, the receiver code generation circuit and the transmitter code generation circuit each maintain each of the N phase segments of the receiver phase rotator and the transmitter phase rotator, respectively, with a minimum current to smooth segment transition boundaries. In implementations, each of the receiver code generation circuit and the transmitter code generation circuit include a first code circuit configured to apply one set of differential pair parameters based on most significant bits and least significant bits of a master code, a second code circuit configured to apply another set of differential pair parameters based on the most significant bits and the least significant bits of the master code, and N multiplexors connected to the first code circuit and the second code circuit, the N multiplexors configured to output N phase offset codes. In implementations, each of the receiver code generation circuit and the transmitter code generation circuit comprise a look-up table to apply receiver phase rotator calibration corrections and transmitter phase rotator calibration corrections, respectively.

In implementations, a method for generating clocks, the method includes generating first N phase offset codes from a calibrated first master code, wherein each phase offset code constrains functionality of a first phase rotator associated with a phase of the input clock to a defined region of operation, generating second N phase offset codes from a calibrated second master code, wherein each phase offset code constrains functionality of a second phase rotator associated with a phase of the input clock to a defined region of operation, rotating an input clock using the first N phase offset codes to match the first channel frequency, and rotating the input clock using the second N phase offset codes to match the second channel frequency, wherein each of the first phase rotator and the second phase rotator are configured to provide continuous rotation of the input clock to track the first channel frequency and the second channel frequency, respectively. In implementations, the method further includes generating a first master code based on a desired frequency offset to match a first channel frequency, generating a second master code based on a desired frequency offset to match a second channel frequency, calibrating the first master code based on characteristics of the first phase rotator to generate a calibrated first master code, and calibrating the second master code based on characteristics of the second phase rotator to generate a calibrated second master code. In implementations, the calibrating the first master code and the calibrating the second master code each further comprise using a look-up table to correct inherent phase rotator non-linearity, phase mismatch between the N phases, gain mismatch between the N phases, path mismatches between phase pairs, and path mismatches at an output. In implementations, the generating first N phase offset codes further comprises applying one set of differential pair parameters based on most significant bits and least significant bits of the first master code to generate a first first output, applying another set of differential pair parameters based on the most significant bits and the least significant bits of the first master code to generate a first second output, and outputting the first N phase offset codes by multiplexing the first output and the second output, and wherein the generating second N phase offset codes further comprises applying one set of differential pair parameters based on most significant bits and least significant bits of the second master code to generate a second first output, applying another set of differential pair parameters based on the most significant bits and the least significant bits of the second master code to generate a second second output, and outputting the first N phase offset codes by multiplexing the second first output and the second second output. In implementations, the generating first N phase offset codes and the generating second N phase offset codes each compensate for arctan effects of a theoretically perfect differential pair and differential pair non-linearities. In implementations, the generating first N phase offset codes further comprises maintaining the first phase rotator associated with a phase of the input clock at a minimum current to smooth transition between phase boundaries and wherein the generating second N phase offset codes further comprises maintaining the second phase rotator associated with a phase of the input clock at a minimum current to smooth transition between phase boundaries.

BRIEF DESCRIPTION OF THE DRAWINGS

The disclosure is best understood from the following detailed description when read in conjunction with the accompanying drawings. It is emphasized that, according to common practice, the various features of the drawings are not to scale. On the contrary, the dimensions of the various features are arbitrarily expanded or reduced for clarity.

DETAILED DESCRIPTION

Figure 1:
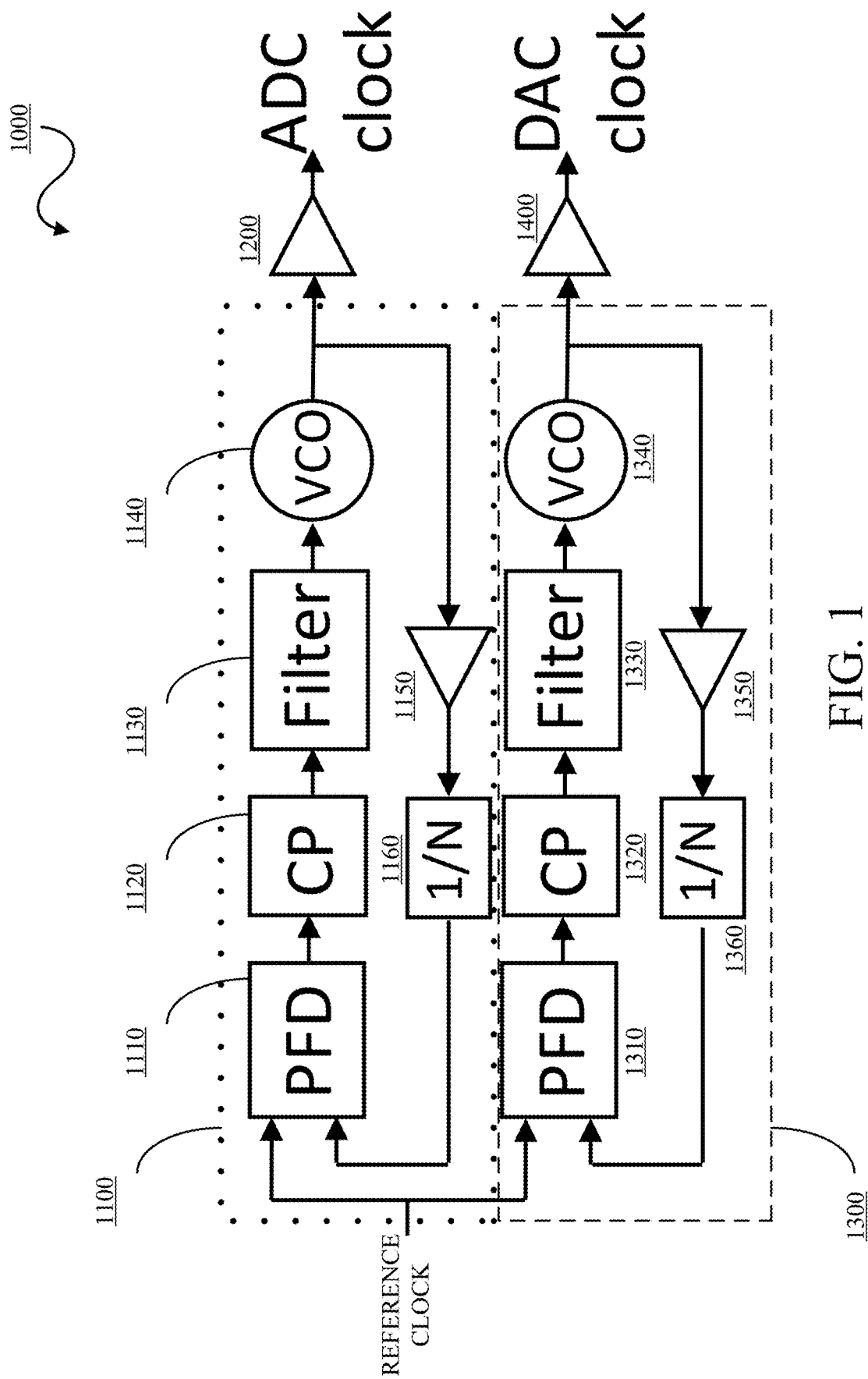
FIG. 1 is a block diagram of an example of a circuit with two phase locked loop circuits for receiver and transmitter clock generation.

Reference will now be made in greater detail to embodiments of the invention, examples of which are illustrated in the accompanying drawings. Wherever possible, the same reference numerals will be used throughout the drawings and the description to refer to the same or like parts.

As used herein, the terminology "computer" or "computing device" includes any unit, or combination of units, capable of performing any method, or any portion or portions thereof, disclosed herein. The computer or computing device may include a processor.

As used herein, the terminology "processor" indicates one or more processors, such as one or more special purpose processors, one or more digital signal processors, one or more microprocessors, one or more controllers, one or more microcontrollers, one or more application processors, one or more central processing units (CPU)s, one or more graphics processing units (GPU)s, one or more digital signal processors (DSP)s, one or more application specific integrated circuits (ASIC)s, one or more application specific standard products, one or more field programmable gate arrays, any other type or combination of integrated circuits, one or more state machines, or any combination thereof.

As used herein, the terminology "memory" indicates any computer-usable or computer-readable medium or device that can tangibly contain, store, communicate, or transport any signal or information that may be used by or in connection with any processor. For example, a memory may be one or more read-only memories (ROM), one or more random access memories (RAM), one or more registers, low power double data rate (LPDDR) memories, one or more cache memories, one or more semiconductor memory devices, one or more magnetic media, one or more optical media, one or more magneto-optical media, or any combination thereof.

As used herein, the terminology "instructions" may include directions or expressions for performing any method, or any portion or portions thereof, disclosed herein, and may be realized in hardware, software, or any combination thereof. For example, instructions may be implemented as information, such as a computer program, stored in memory that may be executed by a processor to perform any of the respective methods, algorithms, aspects, or combinations thereof, as described herein. Instructions, or a portion thereof, may be implemented as a special purpose processor, or circuitry, that may include specialized hardware for carrying out any of the methods, algorithms, aspects, or combinations thereof, as described herein. In some implementations, portions of the instructions may be distributed across multiple processors on a single device, on multiple devices, which may communicate directly or across a network such as a local area network, a wide area network, the Internet, or a combination thereof.

As used herein, the term "application" refers generally to a unit of executable software that implements or performs one or more functions, tasks or activities. The unit of executable software generally runs in a predetermined environment and/or a processor.

As used herein, the terminology "determine" and "identify," or any variations thereof includes selecting, ascertaining, computing, looking up, receiving, determining, establishing, obtaining, or otherwise identifying or determining in any manner whatsoever using one or more of the devices and methods are shown and described herein.

As used herein, the terminology "example," "the embodiment," "implementation," "aspect," "feature," or "element" indicates serving as an example, instance, or illustration. Unless expressly indicated, any example, embodiment, implementation, aspect, feature, or element is independent of each other example, embodiment, implementation, aspect, feature, or element and may be used in combination with any other example, embodiment, implementation, aspect, feature, or element.

As used herein, the terminology "or" is intended to mean an inclusive "or" rather than an exclusive "or." That is unless specified otherwise, or clear from context, "X includes A or B" is intended to indicate any of the natural inclusive permutations. That is if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from the context to be directed to a singular form.

Further, for simplicity of explanation, although the figures and descriptions herein may include sequences or series of steps or stages, elements of the methods disclosed herein may occur in various orders or concurrently. Additionally, elements of the methods disclosed herein may occur with other elements not explicitly presented and described herein. Furthermore, not all elements of the methods described herein may be required to implement a method in accordance with this disclosure. Although aspects, features, and elements are described herein in particular combinations, each aspect, feature, or element may be used independently or in various combinations with or without other aspects, features, and elements.

Further, the figures and descriptions provided herein may be simplified to illustrate aspects of the described embodiments that are relevant for a clear understanding of the herein disclosed processes, machines, manufactures, and/or compositions of matter, while eliminating for the purpose of clarity other aspects that may be found in typical similar devices, systems, compositions and methods. Those of ordinary skill may thus recognize that other elements and/or steps may be desirable or necessary to implement the devices, systems, compositions and methods described herein. However, because such elements and steps are well known in the art, and because they do not facilitate a better understanding of the disclosed embodiments, a discussion of such elements and steps may not be provided herein. However, the present disclosure is deemed to inherently include all such elements, variations, and modifications to the described aspects that would be known to those of ordinary skill in the pertinent art in light of the discussion herein.

Conventional clock generation circuitry uses two clock generation circuits to track a receiver clock for a receiver-transmitter pair implementing a first channel and a transmitter clock for a transmitter-receiver pair implementing a second channel. FIG. 1 is a block diagram of an example of a clock generation circuit 1000 with two phase locked loop circuits for receiver and transmitter clock generation. Clock generation circuit 1000 includes a first phase locked loop (PLL) circuit 1100 for outputting a receiver clock or analog-to-digital converter (ADC) clock via a buffer 1200 and a second PLL circuit 1300 for outputting a transmitter clock or digital-to-analog converter (DAC) clock via a buffer 1400. The operation and function of the PLL circuit 1100 and the PLL circuit 1300 are known to one of skill in the art. The first PLL circuit 1100 includes a phase frequency detector (PFD) 1110, a charge pump (CP) 1120, a filter 1130, a voltage controlled oscillator (VCO) 1140, a feedback buffer 1150, and a divider circuit (1/N) 1160. The PLL circuit 1100 receives a reference clock and a feedback clock and generates the ADC clock. The second PLL circuit 1300 includes a PFD 1310, a CP 1320, a filter 1330, a VCO 1340, a feedback buffer 1350, and a divider circuit (1/N) 1360. The second PLL circuit 1300 receives the reference clock and a feedback clock and generates the DAC clock. Use of two separate PLLs for generating the ADC clock and the DAC clock result in increased power usage and silicon area usage.

Phase rotators can be used in clock generation circuits to accommodate frequency shifts that occur between different cards. Conventional or typical complementary metal-oxide-semiconductor (CMOS) based phase rotators use multiple inverter slices that are individually turned on/off to apply phase weighting to the output. This limits the resolution since higher resolution requires an increased number of inverter slices, which in turn can lead to higher input capacitances due to the number of slices.

Figure 2:
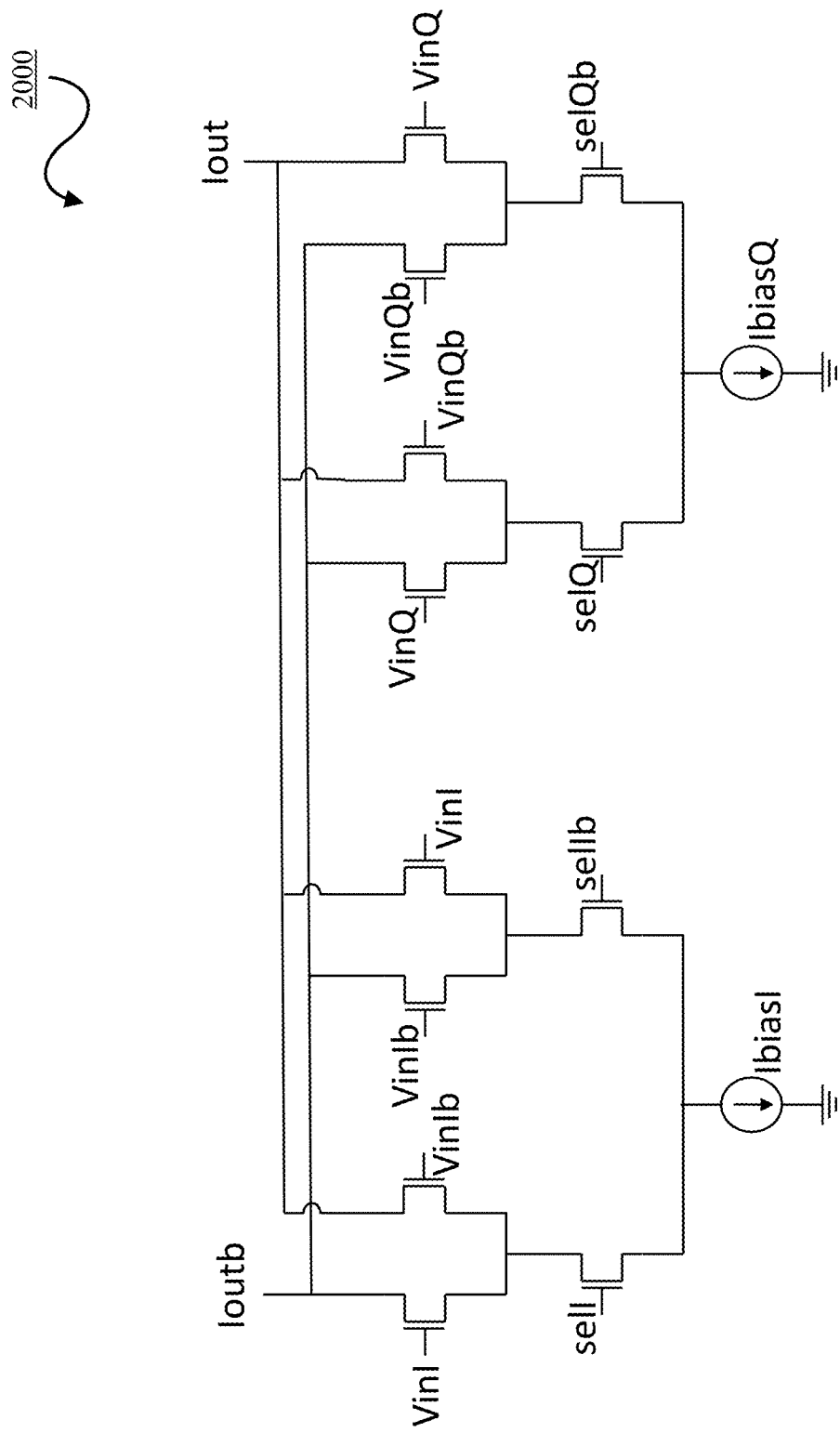
FIG. 2 is a block diagram of an example of a circuit for controlling phase polarity.

FIG. 2 is a block diagram of an example of a circuit 2000 for controlling phase polarity using an XOR circuit. The two input phases are nominally denoted as in-phase (I) and quadrature phase (Q). The circuit 2000 includes a I circuit 2100 and a Q circuit 2200 controlled by a XOR circuit 2300. The I circuit 2100 includes a pair of differential circuits 2110 and 2120 connected to a I bias current (IbiasI) source 2130 via a I selection circuit 2310. The differential circuit 2110 includes a pair of transistors 2112 and 2114. The differential circuit 2120 includes a pair of transistors 2122 and 2124. The I selection circuit 2310 includes a pair of transistors 2312 and 2314. The Q circuit 2200 includes a pair of differential circuits 2210 and 2220 connected to a Q bias current source (IbiasQ) 2230 via a I selection circuit 2320. The differential circuit 2210 includes a pair of transistors 2212 and 2214. The differential circuit 2220 includes a pair of transistors 2222 and 2224. The Q selection circuit 2320 includes a pair of transistors 2322 and 2324. In implementations, the transistors are negative-channel metal-oxide semiconductor (NMOS) devices. In implementations, positive-channel metal-oxide semiconductor (PMOS) devices can be used.

A gate of the transistor 2112 is connected to an I input voltage (VinI), a source of the transistor 2112 is connected to a complementary output current ($\overline{\text{Iout}}$), and a drain is connected to a source of the transistor 2312, which has a gate connected to a I selection signal (selI) and a drain connected to the IbiasI source 2130. A gate of the transistor 2114 is connected to a complementary I input voltage ($\overline{\text{VinI}}$), a source of the transistor 2114 is connected to an output current (Iout), and a drain is connected to the source of the transistor 2312. A gate of the transistor 2122 is connected to a complementary I input voltage ($\overline{\text{VinI}}$), a source of the transistor 2122 is connected to an output current (Iout), and a drain is connected to a source of the transistor 2314, which has a gate connected to a complementary I selection signal ($\overline{\text{selI}}$) and a drain connected to the IbiasI source 2130. A gate of the transistor 2124 is connected to the I input voltage (VinI), a source of the transistor 2124 is connected to the output current (Iout), and a drain is connected to the source of the transistor 2314.

A gate of the transistor 2212 is connected to Q input voltage (VinQ), a source of the transistor 2212 is connected to a complementary output current ($\overline{\text{Iout}}$), and a drain is connected to a source of the transistor 2322, which has a gate connected to a Q selection signal (selQ) and a drain connected to the IbiasQ source 2230. A gate of the transistor 2214 is connected to a complementary Q input voltage ($\overline{\text{VinQ}}$), a source of the transistor 2214 is connected to the output current (Iout), and a drain is connected to the source of the transistor 2322. A gate of the transistor 2222 is connected to a complementary Q input voltage ($\overline{\text{VinQ}}$), a source of the transistor 2222 is connected to the output current (Iout), and a drain is connected to a source of the transistor 2324, which has a gate connected to a complementary Q selection signal ($\overline{\text{selQ}}$) and a drain connected to the IbiasQ source 2230. A gate of the transistor 2224 is connected to the Q input voltage (VinQ), a source of the transistor 2224 is connected to the output current (Iout), and a drain is connected to the source of the transistor 2324.

Current mode logic (CML) phase rotators based on a 2-phase input with XOR control of phase polarity as described can lead to spikes at quadrant boundaries. The CML phase rotators are typically implemented with 1 differential current DAC which limits the ability to apply or implement predistortion. Even with a bias current set to 0, switching this differential pair affects the phase of the output since the bias point of the upper differential pair is changed. Thus, at quadrant boundaries, a jump in phase is seen. Consequently, existing phase rotator designs have poor inherent linearity, limitations on the size of a phase step, large phase jumps at quadrant boundaries, and are not inherently designed or optimized for continuous high-speed rotation for low jitter applications.

Described herein are apparatus, devices, circuits, systems, and methods for highly linear dual phase rotators for continuous rotation. Continuous rotation of the phase rotators in this context refers to the fact that the phase rotator code, which controls the phase rotators, is constantly incrementing or decrementing, constantly changing the phase shift. This is in contrast to a static phase shift with the phase rotator held at one code value indefinitely. In implementations, high linearity phase rotators are designed for continuous rotation of a high speed transmitter or DAC clock and a receiver or ADC clock to implement phase and frequency tracking necessary to generate both clocks from a single PLL. High linearity is provided by using four individual high linearity differential pairs linking a 4-phase clock input to the output. The four differential pairs each have their own non-differential current DAC, which allows for clean transitions at quadrant boundaries and individual predistortion compensation. In implementations, N individual high linearity differential pairs can be used which link a N-phase clock input to the output. Further non-linearity compensation (for both remaining) is provided by a high-speed look-up table. This addresses inherent non-linearities and process and/or mismatch dependent non-linearities.

In implementations, a phase rotator includes four phase rotator circuits. Each phase rotator circuit includes a predistortion code weighted current DAC connected to a highly linear, double transistor stacked current mirror via a bias resistor. The double transistor stacked current mirror connected to a linearized differential pair using resistive degenerations, the linearized differential pair having a cascode stage. The predistortion codes compensate for non-linearity and accounts for both arctan effect of theoretically perfect phase rotators and device non-linearity.

In implementations, a clock generation circuit uses a single PLL for both transmitter and receiver clocks. This reduces power and area requirements, saving manufacturing costs. Overhead in power and area required by the phase rotators are in comparison very small compared to the savings in power by eliminating a PLL. Moreover, low spurs on the transmitter and receiver clocks even when subject to large parts per million (ppm) offsets significantly relax the requirements on a clock recovery system.

In implementations, high inherent linearity combined with high response speed of all components allows for continuous rotation of high-speed clock sufficient to implement frequency shifts needed to compensate for transmitter clock and receiver clock frequency shifts. Linearity is greatly increased by linearizing the differential pair, applying individual, non-differential codes to each of the current DACs with applied predistortion calculated using device and theoretical models. In implementations, a 11-bit input reference code is used to generate four 9-bit codes for each current DAC, allowing for less than a 0.3° phase step. Large phase jumps are removed by using for differential pair with no XOR circuit.

In implementations, high linearity allows for frequency offsets to be implemented with high precision. For example, to implement a 24 ppm frequency offset from a 10G input clock, the phase rotator code can be incremented in steps of 1 at a rate of once every 4 nanoseconds (ns) using a 250 MHz strobe clock. This takes 4.096 microseconds (μs) to add or swallow one full cycle, resulting in a 24 kHz frequency offset. Smaller offsets can be generated by less frequent increments, while larger offsets can be generated by larger increments. Increment step size and frequency affect the output phase, with limited phase resolution and time resolution resulting in a phase offset from an ideal clock at the offset frequency. Thus, to achieve high precision, a high accuracy phase rotator with a large code range and a fast code response is required.

In implementations, a continuous phase rotator design allows a single PLL, based on a single reference clock, to perform clock synthesis for both transmit and receive functions where the output phase can be arbitrarily set (within the limits of converter resolution), and the frequency adjusted within the limits of phase rotator clocking. Vector summing is used in the architecture where in-phase and quadrature weights are established using current sources that are precisely adjusted through a look-up table (LUT) and calibration to provide high phase rotation linearity and to reduce sensitivity to process variation.

Figure 3:
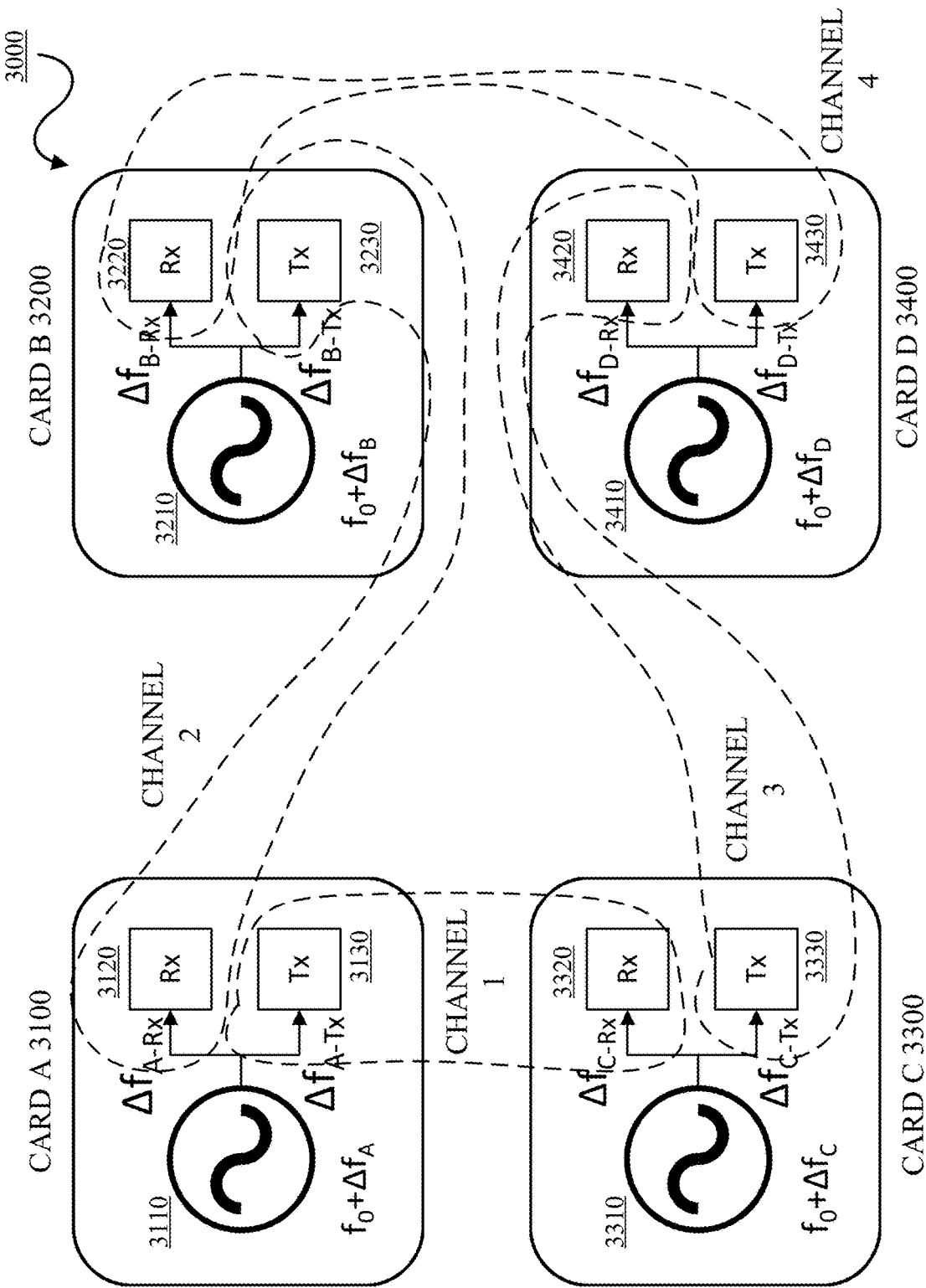
FIG. 3 is a block diagram of an example of a system with multiple receiver-transmitter cards in accordance with embodiments of this disclosure.

FIG. 3 is a block diagram of an example of a system 3000 with multiple receiver-transmitter cards in accordance with embodiments of this disclosure. The system 3000 includes a card A 3100, a card B 3200, a card C 3300, and a card D 3400. The card A 3100 is connected to or in communication with (collectively "connected to" as appropriate) the card B 3200 and the card C 3300, which in turn in connected to the card D 3400. The card B 3200 is connected to the card D 3400. The system 3000 operates at or uses a nominal, base, or fundamental frequency $f_0$.

The card A 3100 can include a voltage controlled oscillator (VCO) 3110 connected to a receiver circuit 3120 and a transmitter circuit 3130. The card A 3100 operates at or uses the nominal frequency $f_0$ plus a card frequency offset $\Delta f_A$. The card B 3200 can include a VCO 3210 connected to a receiver circuit 3220 and a transmitter circuit 3230. The card B 3200 operates at or uses the nominal frequency $f_0$ plus a card frequency offset $\Delta f_B$. The card C 3300 can include a VCO 3310 connected to a receiver circuit 3320 and a transmitter circuit 3330. The card C 3300 operates at or uses the nominal frequency $f_0$ plus a card frequency offset $\Delta f_C$. The card D 3400 can include a VCO 3410 connected to a receiver circuit 3420 and a transmitter circuit 3430. The card D 3400 operates at or uses the nominal frequency $f_0$ plus a card frequency offset $\Delta f_D$.

Channel 1 connects the transmitter 3130 of the card A 3100 to the receiver 3320 of the card C 3300. Channel 1 operates at or uses a frequency common to both the transmitter 3130 and the receiver 3320 (denoted as a channel frequency herein). For example, the channel frequency can be locked or aligned at the frequency of the transmitter 3130, the frequency of the receiver 3320, or somewhere in between. That is, card A 3100 transmitter frequency is equal to card C 3300 receiver frequency. This can be expressed as $\Delta f_A + \Delta f_{A-TX} = \Delta f_C + \Delta f_{C-RX}$.

Channel 2 connects the receiver 3120 of the card A 3100 to the transmitter 3230 of the card B 3200. Channel 2 operates at or uses a frequency common to both the transmitter 3230 and the receiver 3120. For example, the channel frequency can be locked or aligned at the frequency of the transmitter 3230, the frequency of the receiver 3120, or somewhere in between. That is, card A 3100 receiver frequency is equal to card B 3200 transmitter frequency. This can be expressed as $\Delta f_A + \Delta f_{A-RX} = \Delta f_B + \Delta f_{B-TX}$.

Channel 3 connects the transmitter 3330 of the card C 3300 to the receiver 3420 of the card D 3400. Channel 3 operates at or uses a frequency common to both the transmitter 3330 and the receiver 3420. For example, the channel frequency can be locked or aligned at the frequency of the transmitter 3330, the frequency of the receiver 3420, or somewhere in between. That is, card C 3300 transmitter frequency is equal to card D 3400 receiver frequency. This can be expressed as $\Delta f_C + \Delta f_{C-TX} = \Delta f_D + \Delta f_{D-RX}$.

Channel 4 connects the receiver 3220 of the card B 3200 to the transmitter 3430 of the card BD 3400. Channel 4 operates at or uses a frequency common to both the transmitter 3430 and the receiver 3220. For example, the channel frequency can be locked or aligned at the frequency of the transmitter 3430, the frequency of the receiver 3220, or somewhere in between. That is, card B 3200 receiver frequency is equal to card D 3400 transmitter frequency. This can be expressed as $\Delta f_B + \Delta f_{B-RX} = \Delta f_D + \Delta f_{D-TX}$.

The phase rotators described herein are provided on each card to continuously rotate the phases of the transmitter and receiver clocks, respectively, to provide the frequency offsets such as $\Delta f_{A-TX}$, $\Delta f_{C-RX}$, $\Delta f_{A-RX}$, $\Delta f_{B-TX}$, $\Delta f_{C-TX}$, $\Delta f_{D-RX}$, $\Delta f_{B-RX}$, and $\Delta f_{D-TX}$, respectively, as shown for example in FIG. 3, to operate at the channel frequency of the respective channel as determined for each transmitter and receiver pair.

Figure 4:
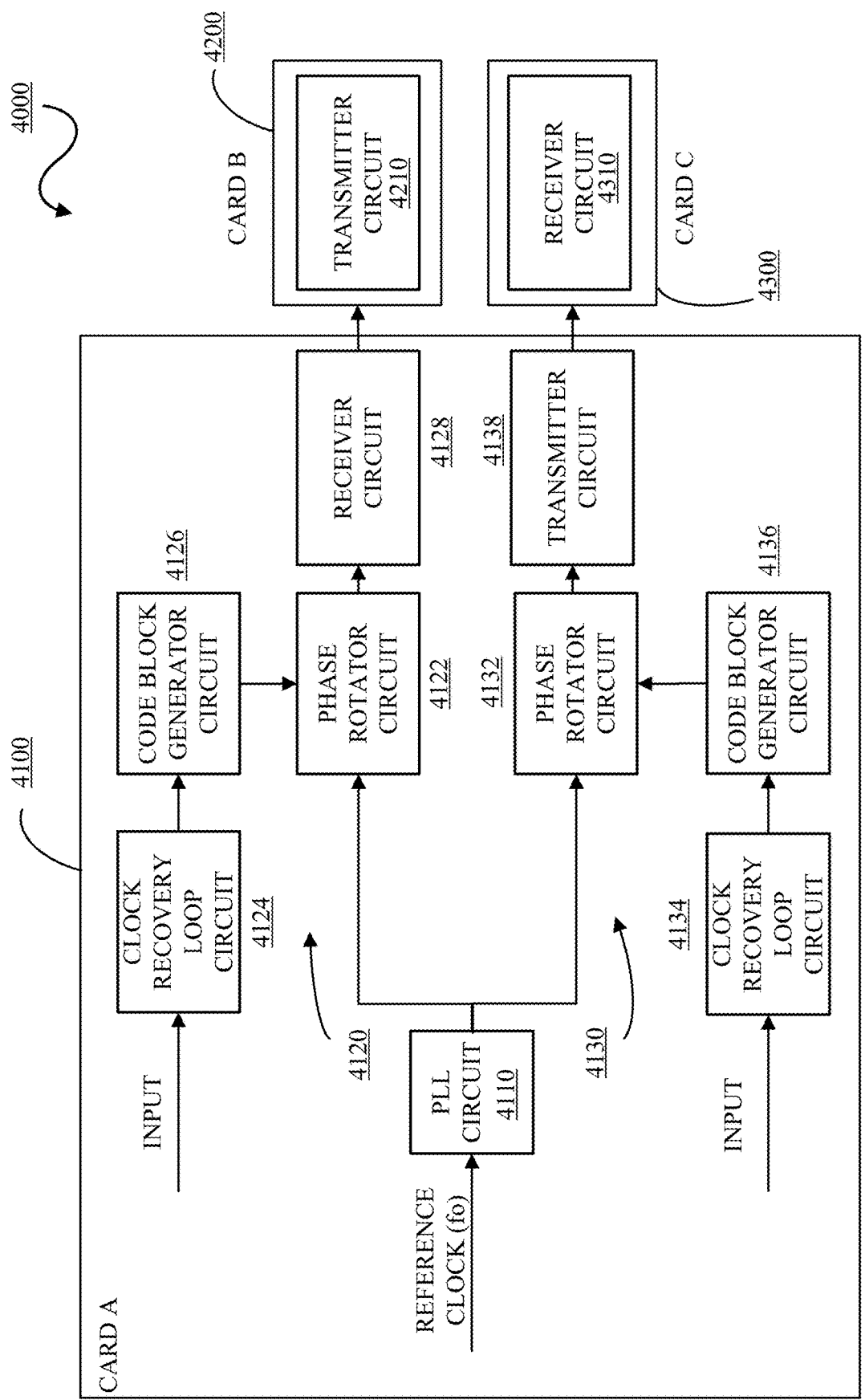
FIG. 4 is a block diagram of an example of a system using a highly linear dual phase rotator circuit in accordance with embodiments of this disclosure.

FIG. 4 is a block diagram of an example of a system 4000 using a highly linear dual phase rotator circuit in accordance with embodiments of this disclosure. The system 4000 can include a card A 4100, a card B 4200, and a card C 4300. The card A 4100 is connected to the card B 4200 and to the card C 4300. Each of the cards operate at or use a nominal frequency or reference clock $f_0$ and have a card frequency offset.

The card A 4100 can include a PLL circuit 4110 connected to a receiver clock generation path 4120 and a transmitter clock generation path 4130. The receiver clock generation path 4120 can include a phase rotator circuit 4122, a clock recovery loop circuit 4124, a code block generator circuit 4126, and a receiver circuit 4128. The transmitter clock generation path 4130 can include a phase rotator circuit 4132, a clock recovery loop circuit 4134, a code block generator circuit 4136, and a transmitter circuit 4138. The card B 4200 includes a transmitter circuit 4210 and the card C 4300 includes a receiver circuit 4310. The receiver circuit 4128 and the transmitter circuit 4210 can operate at a first channel frequency. The transmitter circuit 4138 and the receiver circuit 4310 can operate at a second channel frequency. The first channel frequency and the second channel frequency can be different or the same. The first channel frequency and the second channel frequency can be based on the reference clock $f_0$. The first channel frequency and the second channel frequency can be selected or designated.

Operationally, the PLL circuit 4110 can output an output clock based on a reference clock and a feedback clock. The output clock is input to the receiver clock generation path 4120 and the transmitter clock generation path 4130. The clock recovery loop circuit 4124 can determine a reference code associated with the amount of frequency offset needed to match or align with the first channel frequency. The code block generator circuit 4126 can generate N weighting codes, one for each of N phase rotator segments in the phase rotator circuit 4122. Each weighting code accounts for device and performance non-linearities present in the phase rotator circuit 4122. The phase rotator circuit 4122 can apply continuous phase rotation to the output clock based on the N weighting codes to generate a receiver clock at the first channel frequency. The receiver clock is input to the receiver circuit 4128 for eventual communication with the transmitter circuit 4210. The clock recovery loop circuit 4134 can determine a reference code associated with the amount of frequency offset needed to match or align with the second channel frequency. The code block generator circuit 4136 can generate N weighting codes, one for each of N phase rotator segments in the phase rotator circuit 4132, where N is the number of input clock phases. For example, if N is 4, then the input clock phases are in-phase (I), $\bar{\text{I}}$, quadrature phase (Q), and $\bar{\text{Q}}$. If N is 8, then Π/4 shifts of the above can be added to establish the 8 input clock phases. Each weighting code accounts for device and performance non-linearities present in the phase rotator circuit 4132. The phase rotator circuit 4132 can apply continuous phase rotation to the output clock based on the N weighting codes to generate a transmitter clock at the second channel frequency. Phase step size (amount of phase offset applied in one step) and strobe rate (rate of applying the step size) can be controllable. The transmitter clock is input to the transmitter circuit 4138 for eventual communication with the receiver circuit 4310.

Figure 5:
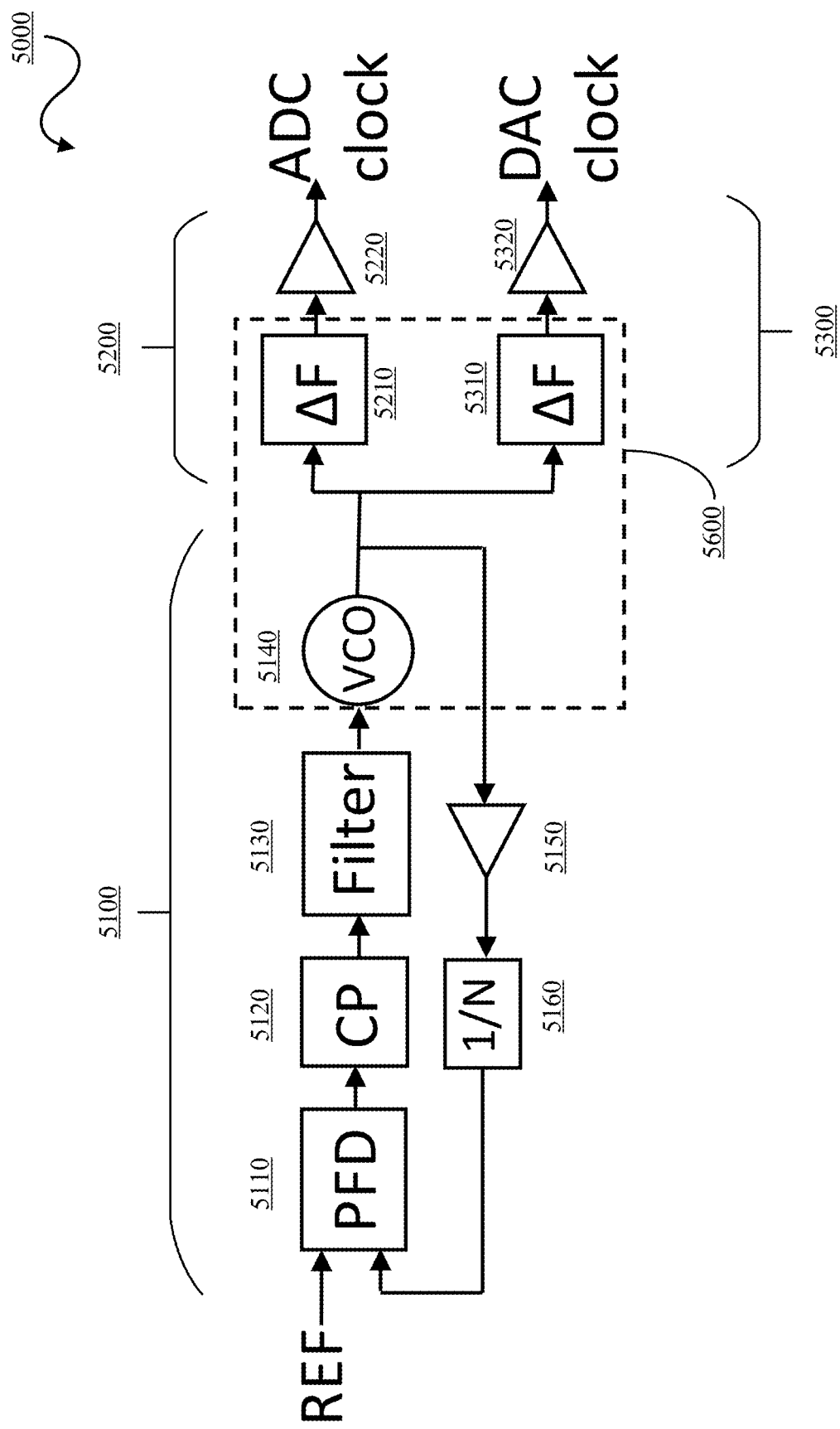
FIG. 5 is a block diagram of a clock generation circuit using a highly linear dual phase rotator circuit in accordance with embodiments of this disclosure.

FIG. 5 is a block diagram of a clock generation circuit 5000 using a highly linear dual phase rotator circuit in accordance with embodiments of this disclosure. The clock generation circuit 5000 can include a PLL 5100 connected to a receiver path 5200 and a transmitter path 5300. The PLL 5100 can include a phase frequency detector (PFD) 5110, a charge pump 5120, a filter 5130, a VCO 5140, a buffer 5150, and a divider (1/N) 5160. The receiver path 5200 can include a highly linear, continuous rotation phase rotator 5210 and a buffer 5220. The transmitter path 5300 can include a highly linear, continuous rotation phase rotator 5310 and a buffer 5320.

Operationally, the PFD 5110 outputs an error signal that is proportional to a phase difference between a reference clock and a feedback clock. The error signal is processed through the charge pump 5120, the filter 5130, and applied to the VCO 5140 to produce a clock output that tracks the phase of the reference clock. The feedback clock of the PLL 5110 is generated from the clock output as processed through the buffer 5150 and the divider circuit 5160. The clock output is input to the receiver path 5200 and the transmitter path 5300. The highly linear, continuous rotation phase rotator 5210 can apply a phase offset to the clock output to match a defined operational frequency of an ADC clock. The highly linear, continuous rotation phase rotator 5210 can generate the phase offset using weighted N input phase clocks. The highly linear, continuous rotation phase rotator 5310 can apply a phase offset to the clock output to match a defined operational frequency of a DAC clock. The highly linear, continuous rotation phase rotator 5310 can generate the phase offset using weighted N input phase clocks. Phase offset step size (amount of phase offset applied in one step) and strobe rate (rate of applying the step size) can be controllable.

Figure 6:
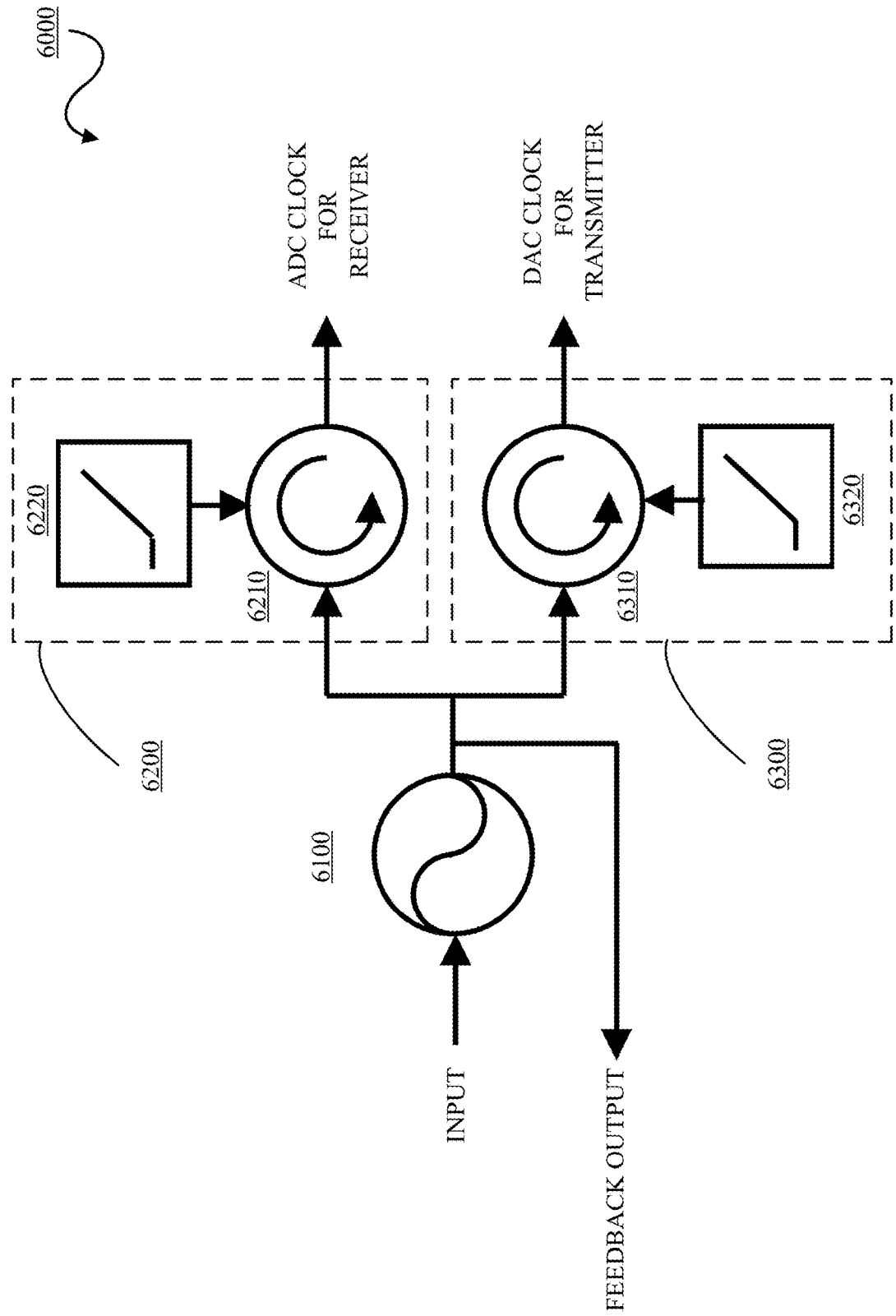
FIG. 6 is a block diagram of a system including highly linear dual phase rotators in accordance with embodiments of this disclosure.

FIG. 6 is a block diagram of a system 6000 including highly linear dual phase rotators in accordance with embodiments of this disclosure. The system 6000 can include a VCO 6100, a receiver phase rotator circuit 6200, and a transmitter phase rotator circuit 6300. The receiver phase rotator circuit 6200 can include a phase rotator 6210 and a code generation circuit 6220. The transmitter phase rotator circuit 6300 can include a phase rotator 6310 and a code generation circuit 6320.

Operationally, the VCO 6100 can generate an output clock based on a reference clock and a feedback clock, shown collectively as INPUT in FIG. 6. The output clock is input to the receiver phase rotator circuit 6200 and the transmitter phase rotator circuit 6300. The code generation circuit 6220 can generate N phase offset codes to generate a frequency offset to match the output clock to an ADC clock for a receiver, where the ADC clock is configurable, selectable, or defined. The receiver phase rotator circuit 6200 can apply the N phase offset codes to N input phase clocks to phase rotate the output clock to generate the ADC clock. In implementations, a phase offset step size (amount of phase offset applied in one step) and strobe rate (rate of applying the step size) can be controllable.

Figure 7:
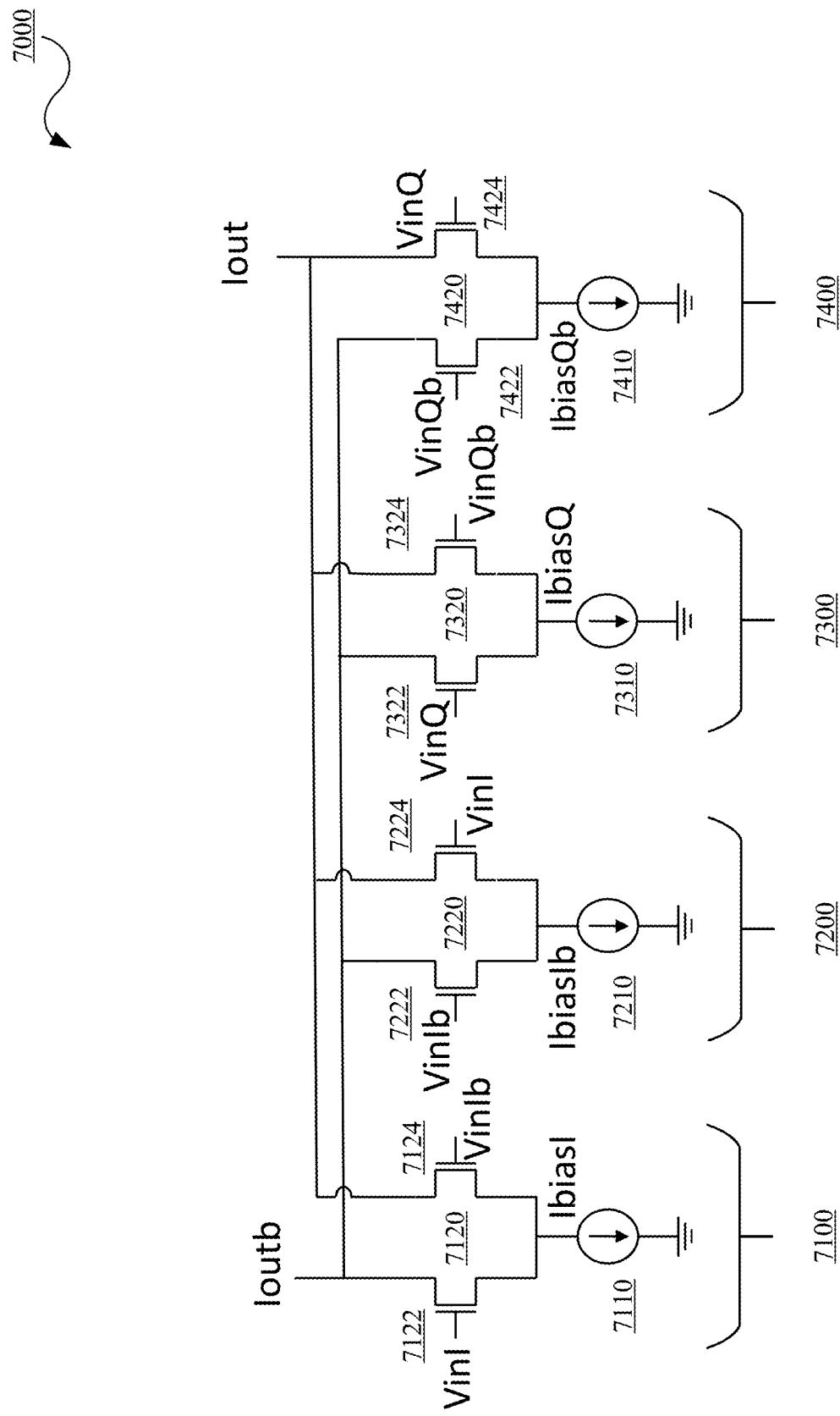
FIG. 7 is a block diagram of a highly linear phase rotator circuit in accordance with embodiments of this disclosure.

FIG. 7 is a block diagram of a highly linear phase rotator 7000 in accordance with embodiments of this disclosure. The highly linear phase rotator 7000 can be implemented in the systems and circuits of FIGS. 3-6. The highly linear phase rotator 7000 can include four phase rotator segments 7100, 7200, 7300, and 7400 corresponding to four separate currents I, $\bar{\text{I}}$, Q, and $\bar{\text{Q}}$. Each of the phase rotator segments 7100, 7200, 7300, and 7400 has an output connected to an output current (Iout) and another output connected to a complementary output current ($\bar{\text{I}}$out).

The phase rotator segment 7100 can include a I current source 7110 connected to a differential pair 7120. The differential pair 7120 can include a transistor 7122 and a transistor 7124. The gate of the transistor 7122 is connected to an I input voltage (VinI), the drain is connected to the I current source 7110, and the source is connected to $\bar{\text{I}}$out. The gate of the transistor 7124 is connected to an $\bar{\text{I}}$ input voltage (Vin$\bar{\text{I}}$), the drain is connected to the I current source 7110, and the source is connected to Iout.

The phase rotator segment 7200 can include a $\bar{\text{I}}$ current source 7210 connected to a differential pair 7220. The differential pair 7220 can include a transistor 7222 and a transistor 7224. The gate of the transistor 7222 is connected to Vin$\bar{\text{I}}$, drain is connected to the $\bar{\text{I}}$ current source 7210, and the source is connected to $\bar{\text{I}}$out. The gate of the transistor 7224 is connected to VinI, the drain is connected to the $\bar{\text{I}}$ current source 7210, and the source is connected to Iout.

The phase rotator segment 7300 can include a Q current source 7310 connected to a differential pair 7320. The differential pair 7320 can include a transistor 7322 and a transistor 7324. The gate of the transistor 7322 is connected to a Q input voltage (VinQ), the drain is connected to the Q current source 7310, and the source is connected to $\bar{\text{I}}$out. The gate of the transistor 7324 is connected to a $\bar{\text{Q}}$ input voltage (Vin$\bar{\text{Q}}$), the drain is connected to the Q current source 7310, and the source is connected to Iout.

The phase rotator segment 7400 can include a $\bar{\text{Q}}$ current source 7410 connected to a differential pair 7420. The differential pair 7420 can include a transistor 7422 and a transistor 7424. The gate of the transistor 7422 is connected to Vin$\bar{\text{Q}}$, drain is connected to the $\bar{\text{Q}}$ current source 7410, and the source is connected to $\bar{\text{I}}$out. The gate of the transistor 7424 is connected to VinQ, the drain is connected to the $\bar{\text{Q}}$ current source 7410, and the source is connected to Iout.

Usage of the four phase rotator segments 7100, 7200, 7300, and 7400 results in smooth transitions at quadrant boundaries. The I/$\bar{\text{I}}$ and Q/$\bar{\text{Q}}$ differential currents can be gradually shifted on and off with changes in the input bias currents provided by the I current source 7110, the $\overline{\text{I}}$ current source 7210, the Q current source 7310, and the $\overline{\text{Q}}$ current source 7410, namely, input bias currents IbiasI, Ibias$\overline{\text{I}}$, IbiasQ, and Ibias$\overline{\text{Q}}$, respectively.

Figure 8:
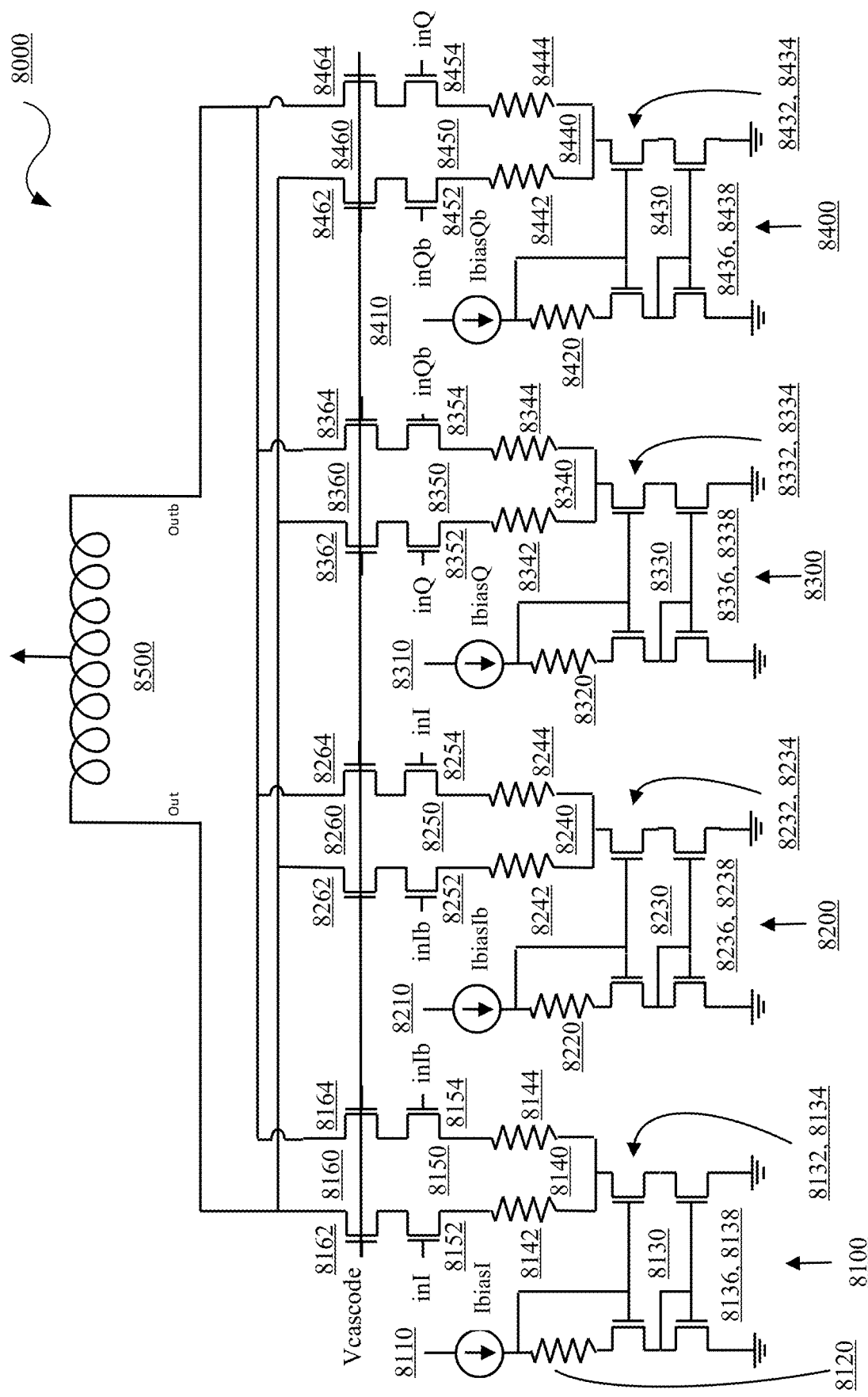
FIG. 8 is a block diagram of a highly linear phase rotator circuit in accordance with embodiments of this disclosure.

FIG. 8 is a block diagram of a highly linear phase rotator 8000 in accordance with embodiments of this disclosure. The highly linear phase rotator 8000 can be implemented in the systems and circuits of FIGS. 3-7. The highly linear phase rotator 8000 can include four phase rotator segments 8100, 8200, 8300, and 8400 corresponding to four separate currents I, $\overline{\text{I}}$, Q, and $\overline{\text{Q}}$. Each of the phase rotator segments 8100, 8200, 8300, and 8400 includes a current source, such as a current DAC, connected to a two stage current mirror via a bias resistor. The current mirror is connected to a differential pair via a degeneration resistor. The differential pair is connected to an inductive load via a cascode stage buffer. Each of the current DACs are independently driven by a respective offset code, where the offset codes are generated from a master code based on a desired frequency offset and non-linearity factors associated with a specific phase rotator segment. Consequently, each of the phase rotator segments 8100, 8200, 8300, and 8400 are weighted differently to contribute some current to the output current. This improves smoothness as between each of the phase quadrants or segments. The bias resistor is provided to improve the drain-to-source voltage ($V_{DS}$) matching. The two stage current mirror provides increased output impedance and improves matching between the current DAC and the differential pair. Moreover, the current mirror adds inherent finite impulse response filtering. The degeneration resistor reduces gain to reduce clipping in non-linear regions of operation of the differential pair. The cascode stage buffers the output current and reduces sensitivity of the differential pair transconductance (gm) on output conditions. Although four segments are described herein, N segments can be used as described herein.

The phase rotator segment 8100 can include a I current source 8110 connected to a two stage current mirror 8130 via a bias resistor 8120. The two stage current mirror 8130 is connected to a differential pair 8150 via a degenerative resistor circuit 8140. The differential pair 8150 is connected to an inductive load 8500 via a cascode stage buffer circuit 8160. The two stage current mirror 8130 includes a first pair of transistors 8132 and 8134 and a second pair of transistors 8136 and 8138. A gate of the transistor 8132 is connected to an output of the I current source 8110 and to a gate of the transistor 8134, a source is connected to one end of the bias resistor 8120 (which has another end connected to the output of the I current source 8110), and a drain connected to a source of the transistor 8136, a gate of the transistor 8136, and a gate of the transistor 8138. A source of the transistor 8134 is connected to the degenerative resistor circuit 8140 and a drain is connected to source of the transistor 8138. A drain of the transistor 8136 is connected to ground. A drain of the transistor 8138 is connected to ground. The degenerative resistor circuit 8140 includes a resistor 8142 and a resistor 8144, both having one end connected to the source of the transistor 8134. The differential pair 8150 includes a transistor 8152 and a transistor 8154. The cascode stage buffer circuit 8160 includes a transistor 8162 and a transistor 8164. A gate of the transistor 8152 is connected to I input voltage, a source is connected to a drain of the transistor 8162, and a drain is connected to another end of the resistor 8142. A gate of the transistor 8154 is connected to $\overline{\text{I}}$ input voltage, a source is connected to a drain of the transistor 8164, and a drain is connected to another end of the resistor 8144. A gate of the transistor 8162 is connected to a gate of the transistor 8164, which are connected to a cascode voltage ($V_{cascode}$) and a source is connected to one end of the inductive load 8500 for outputting an output voltage. A source of the transistor 8164 is connected another end of the inductive load 8500 for outputting a complementary output voltage.

The phase rotator segment 8200 can include a $\overline{\text{I}}$ current source 8210 connected to a two stage current mirror 8230 via a bias resistor 8220. The two stage current mirror 8230 is connected to a differential pair 8250 via a degenerative resistor circuit 8240. The differential pair 8250 is connected to the inductive load 8500 via a cascode stage buffer circuit 8260. The two stage current mirror 8230 includes a first pair of transistors 8232 and 8234 and a second pair of transistors 8236 and 8238. A gate of the transistor 8232 is connected to an output of the $\overline{\text{I}}$ current source 8210 and to a gate of the transistor 8234, a source is connected to one end of the bias resistor 8220 (which has another end connected to the output of the $\overline{\text{I}}$ current source 8210), and a drain connected to a source of the transistor 8236, a gate of the transistor 8236, and a gate of the transistor 8238. A source of the transistor 8234 is connected to the degenerative resistor circuit 8240 and a drain is connected to source of the transistor 8238. A drain of the transistor 8236 is connected to ground. A drain of the transistor 8238 is connected to ground. The degenerative resistor circuit 8240 includes a resistor 8242 and a resistor 8244, both having one end connected to the source of the transistor 8234. The differential pair 8250 includes a transistor 8252 and a transistor 8254. The cascode stage buffer circuit 8260 includes a transistor 8262 and a transistor 8264. A gate of the transistor 8252 is connected to $\overline{\text{I}}$ input voltage, a source is connected to a drain of the transistor 8262, and a drain is connected to another end of the resistor 8242. A gate of the transistor 8254 is connected to I input voltage, a source is connected to a drain of the transistor 8264, and a drain is connected to another end of the resistor 8244. A gate of the transistor 8262 is connected to a gate of the transistor 8264, which are connected to the cascode voltage ($V_{cascode}$) and a source is connected to one end of the inductive load 8500 for outputting an output voltage. A source of the transistor 8264 is connected another end of the inductive load 8500 for outputting a complementary output voltage.

The phase rotator segment 8300 can include a Q current source 8310 connected to a two stage current mirror 8330 via a bias resistor 8320. The two stage current mirror 8330 is connected to a differential pair 8350 via a degenerative resistor circuit 8340. The differential pair 8350 is connected to the inductive load 8500 via a cascode stage buffer circuit 8360. The two stage current mirror 8330 includes a first pair of transistors 8332 and 8334 and a second pair of transistors 8336 and 8338. A gate of the transistor 8332 is connected to an output of the Q current source 8310 and to a gate of the transistor 8334, a source is connected to one end of the bias resistor 8320 (which has another end connected to the output of the Q current source 8310), and a drain connected to a source of the transistor 8336, a gate of the transistor 8336, and a gate of the transistor 8338. A source of the transistor 8334 is connected to the degenerative resistor circuit 8340 and a drain is connected to source of the transistor 8338. A drain of the transistor 8336 is connected to ground. A drain of the transistor 8338 is connected to ground. The degenerative resistor circuit 8340 includes a resistor 8342 and a resistor 8344, both having one end connected to the source of the transistor 8334. The differential pair 8350 includes a transistor 8352 and a transistor 8354. The cascode stage buffer circuit 8360 includes a transistor 8362 and a transistor 8364. A gate of the transistor 8352 is connected to Q input voltage, a source is connected to a drain of the transistor 8362, and a drain is connected to another end of the resistor 8342. A gate of the transistor 8354 is connected to $\overline{Q}$ input voltage, a source is connected to a drain of the transistor 8364, and a drain is connected to another end of the resistor 8344. A gate of the transistor 8362 is connected to a gate of the transistor 8364, which are connected to the cascode voltage ($V_{cascode}$) and a source is connected to one end of the inductive load 8500 for outputting an output voltage. A source of the transistor 8364 is connected another end of the inductive load 8500 for outputting a complementary output voltage.

The phase rotator segment 8400 can include a $\overline{Q}$ current source 8410 connected to a two stage current mirror 8430 via a bias resistor 8420. The two stage current mirror 8430 is connected to a differential pair 8450 via a degenerative resistor circuit 8440. The differential pair 8450 is connected to the inductive load 8500 via a cascode stage buffer circuit 8460. The two stage current mirror 8430 includes a first pair of transistors 8432 and 8434 and a second pair of transistors 8436 and 8438. A gate of the transistor 8432 is connected to an output of the $\overline{Q}$ current source 8410 and to a gate of the transistor 8434, a source is connected to one end of the bias resistor 8420 (which has another end connected to the output of the $\overline{Q}$ current source 8410), and a drain connected to a source of the transistor 8436, a gate of the transistor 8436, and a gate of the transistor 8438. A source of the transistor 8434 is connected to the degenerative resistor circuit 8440 and a drain is connected to source of the transistor 8438. A drain of the transistor 8436 is connected to ground. A drain of the transistor 8438 is connected to ground. The degenerative resistor circuit 8440 includes a resistor 8442 and a resistor 8444, both having one end connected to the source of the transistor 8434. The differential pair 8450 includes a transistor 8452 and a transistor 8454. The cascode stage buffer circuit 8460 includes a transistor 8462 and a transistor 8464. A gate of the transistor 8452 is connected to $\overline{Q}$ input voltage, a source is connected to a drain of the transistor 8462, and a drain is connected to another end of the resistor 8442. A gate of the transistor 8454 is connected to Q input voltage, a source is connected to a drain of the transistor 8464, and a drain is connected to another end of the resistor 8244. A gate of the transistor 8462 is connected to a gate of the transistor 8464, which are connected to the cascode voltage ($V_{cascode}$) and a source is connected to one end of the inductive load 8500 for outputting an output voltage. A source of the transistor 8464 is connected another end of the inductive load 8500 for outputting a complementary output voltage.

Operationally, each of the current sources 8110, 8210, 8310, and 8410 are driven by a phase segment code which performs as a weight for determining how much of the input current in each phase segment 8100, 8200, 8300, and 8400 contributes to the output voltage. That is, the phase offset is a weighted contribution of each of the phase segments.

Operation of the differential pair introduces non-linearities and creates spurs and jitter in the clock signals. These higher order non-linearities can be removed or mitigated by determining theoretical non-linear current characteristics based on theoretical non-linearities of the devices, which can then be addressed by using a look-up table. Some process variation will be present but can be removed or mitigated through calibration and the use of the look-up table.

Figure 9:
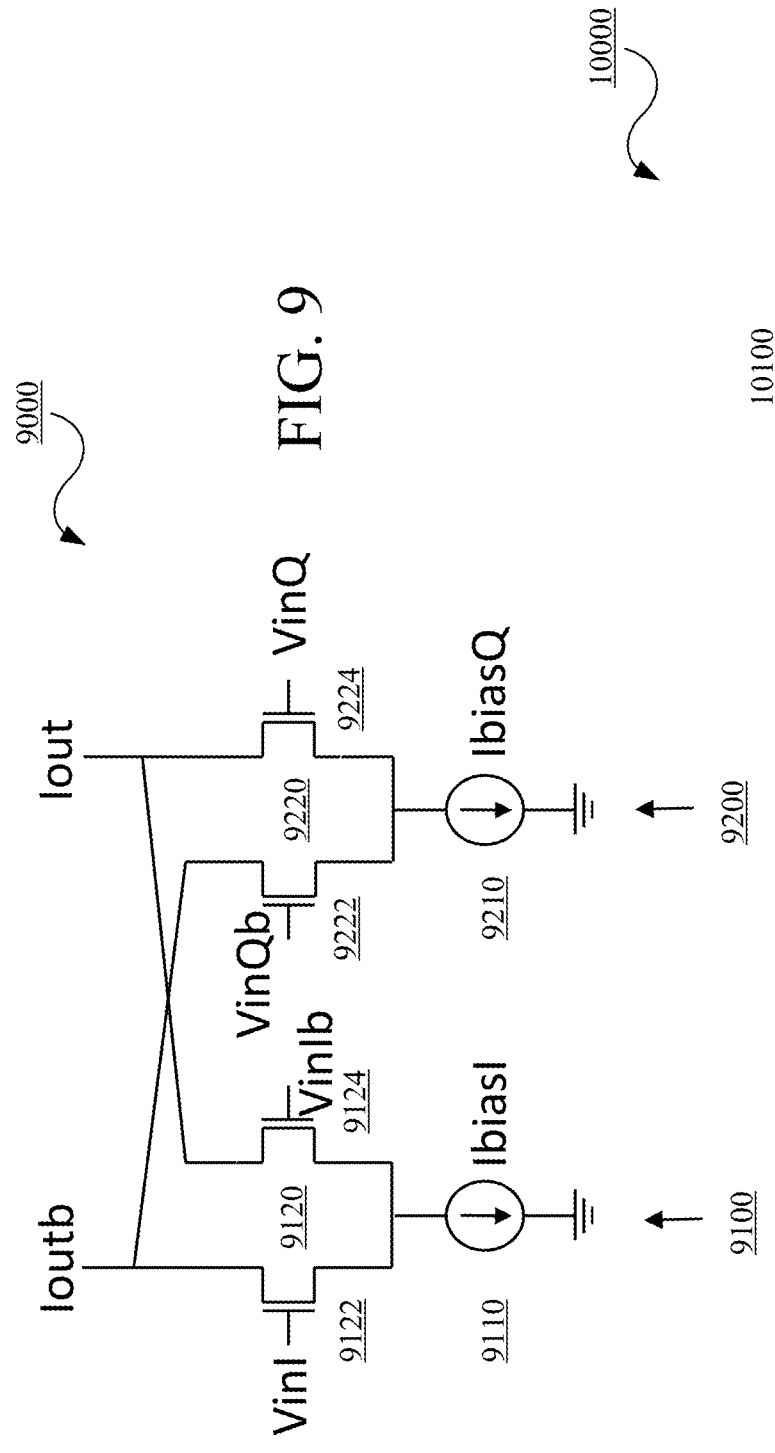
FIG. 9 is a block diagram of a differential pair circuit in accordance with embodiments of this disclosure.

Determination of non-linear current characteristics can be analyzed by examining circuit 9000 in FIG. 9. Circuit 9000 includes a first segment 9100 and a second segment 9200. The first segment 9100 includes a current source 9110 connected to a differential pair 9120, where the differential pair 9120 includes a transistor 9122 and a transistor 9124. The second segment 9200 includes a current source 9210 connected to a differential pair 9220, where the differential pair 9220 includes a transistor 9222 and a transistor 9224. A gate of the transistor 9122 is connected to an I input voltage, a source is connected to a complementary output voltage, and a drain is connected to the current source 9110. A gate of the transistor 9124 is connected to an $\overline{I}$ input voltage, a source is connected to an output current, and a drain is connected to the current source 9110. A gate of the transistor 9222 is connected to a $\overline{Q}$ input voltage, a source is connected to a complementary output voltage, and a drain is connected to the current source 9210. A gate of the transistor 9224 is connected to Q input voltage, a source is connected to an output current, and a drain is connected to the current source 9210.

If passive resistive or inductive loading is used, then the output voltage is linear to Iout:

$$I_{out} = g_{mI} V_{inI} + g_{mQ} V_{inQ} \qquad \text{Equation (1)}$$

Since:

$$g_m = k\sqrt{I_d} \qquad \text{Equation (2)}$$

Then:

$$I_{out} = C(\sqrt{I_{biasI}} V_{inI} + \sqrt{I_{biasQ}} V_{inQ}) \qquad \text{Equation (3)}$$

Figure 11:
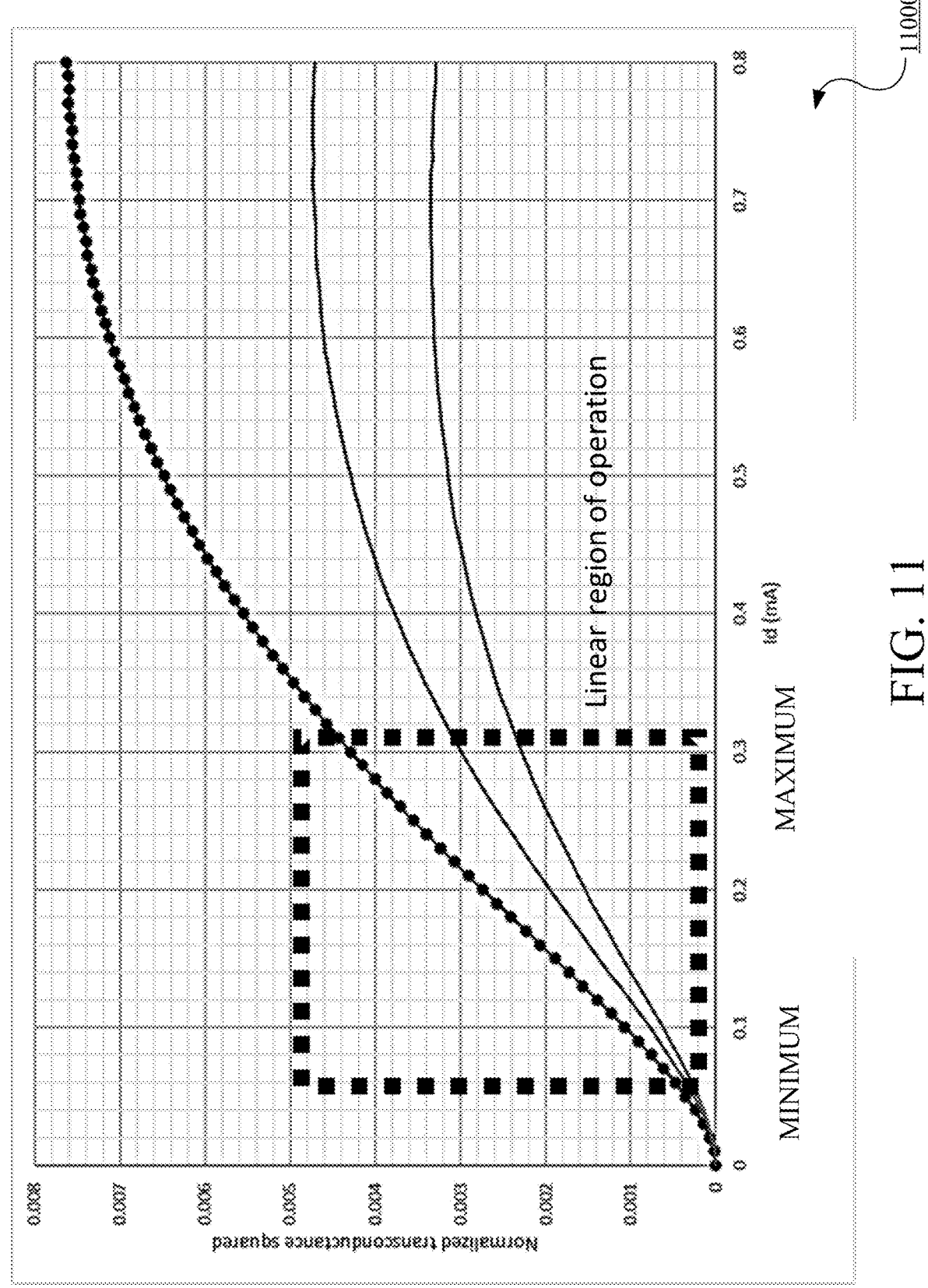
FIG. 11 is a graph of a region of operation for a differential pair in accordance with embodiments of this disclosure.

The derivations above are based on a square root transconductance versus current (I) relationship. The relationship is shown in FIG. 11. This relationship occurs in an active region of device operation with moderate $V_{GS}$. If $V_{GS}$ is too low, then the device is in a sub-threshold region. If $V_{GS}$ is too high, other effects come into play including short channel effects, clipping due to supply limits, and the like.

Subthreshold region of operation should be avoided. There is a region of operation where the gm vs I relationship is linear or substantially linear, identified as the "linear region of operation" in FIG. 11. Maintaining the device in the linear region of operation can be accomplished through adjustments in the current characteristic to keep a minimum current flowing in all differential pairs so that subthreshold operation is avoided. Code generation block can be set and the codes generated therefrom to stay in the linear region of operation. For example, minimum and maximum current settings can be used in code generation equations as described herein.

The above square model provides a rough approximation and other non-linearities are not cancelled out and difficult to do so without empirical modeling. This is particularly true for larger signal levels. For example, residual currents in opposite phase differential pairs have a disproportionate effect on reducing the overall gain.

Figure 10:
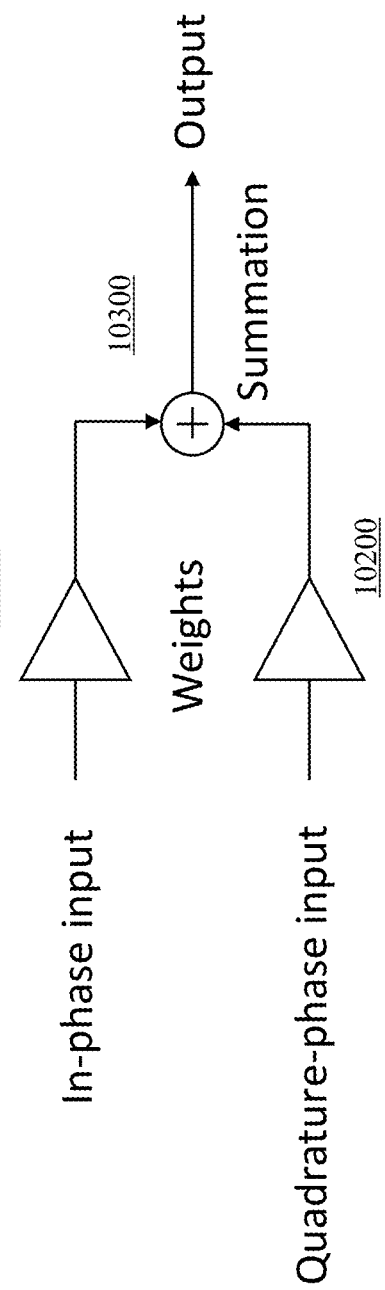
FIG. 10 is a block diagram of an ideal system with phase rotator weights in accordance with embodiments of this disclosure.

FIG. 10 is a block diagram of an ideal system 10000 with phase rotator weights in accordance with embodiments of this disclosure. The system 10000 includes weight buffers 10100 and 10200 and a summer 10300. In-phase and quadrature-phase inputs can have weights applied at the weight buffers 10100 and 10200, respectively, and the summer 10300 can sum the weighted inputs to determine an output current. That is, the output current (the phase offset) is a vector summation of weighted input currents (where a weight is the code as represented by a particular bias current that is applied to a particular current in a phase rotator segment). Ideal characteristic can be derived from the ideal output as shown:

$$x(t,\varphi)=A*\sin(\omega t+\varphi) \quad \text{Equation (4)}$$

$$x(t,\varphi)=A*\cos(\varphi)*\sin(\omega t)+A*\sin(\varphi)*\cos(\omega t) \quad \text{Equation (5)}$$

Thus, for a given angle phi $\varphi$, $\cos(\varphi)$ and $\sin(\varphi)$ are the ideal weights for the quadrature inputs as shown in FIG. 10. Based on Equations (1) through (5), an ideal current value can be derived:

$$I_{out}=g_{mI}v_{inI}+g_{mIb}v_{inIb}+g_{mQ}v_{inQ}+g_{mQb}v_{inQb}$$

$$=g_{mI}B\sin\omega t - g_{mIb}B\sin\omega t + g_{mQ}B\cos\omega t - g_{mQb}B\cos\omega t$$

$$=C\sin\omega t(\sqrt{I_i}-\sqrt{I_{ib}})+C\cos\omega t(\sqrt{I_q}-\sqrt{I_{qb}})=A\cos\varphi\sin\omega t + A\sin\varphi\cos\omega t \quad \text{Equation (6)}$$

This gives:

$$\cos\varphi=k(\sqrt{I_i}-\sqrt{I_{ib}}) \text{ and } \sin\varphi=k(\sqrt{I_q}-\sqrt{I_{qb}}) \quad \text{Equation (7)}$$

Set $$I_i=(\alpha+f(\varphi))^2 \text{ and } I_{ib}=(\alpha-f(\varphi))^2 \quad \text{Equation (8)}$$

This gives:

$$\cos\varphi=k(\sqrt{I_i}-\sqrt{I_{ib}})=2kf(\varphi) \text{ which makes } f(\varphi)=\beta\cos\varphi \quad \text{Equation (9)}$$

Similar equations can be derived for the rest of the currents.

If we set $I_{max}$ and $I_{min}$ as maximum and minimum current constraints (from FIG. 11), we get:

$$\alpha=0.5(\sqrt{I_{max}}+\sqrt{I_{min}}), \text{ and } \beta=0.5(\sqrt{I_{max}}-\sqrt{I_{min}}) \quad \text{Equation (10)}$$

Figure 12:
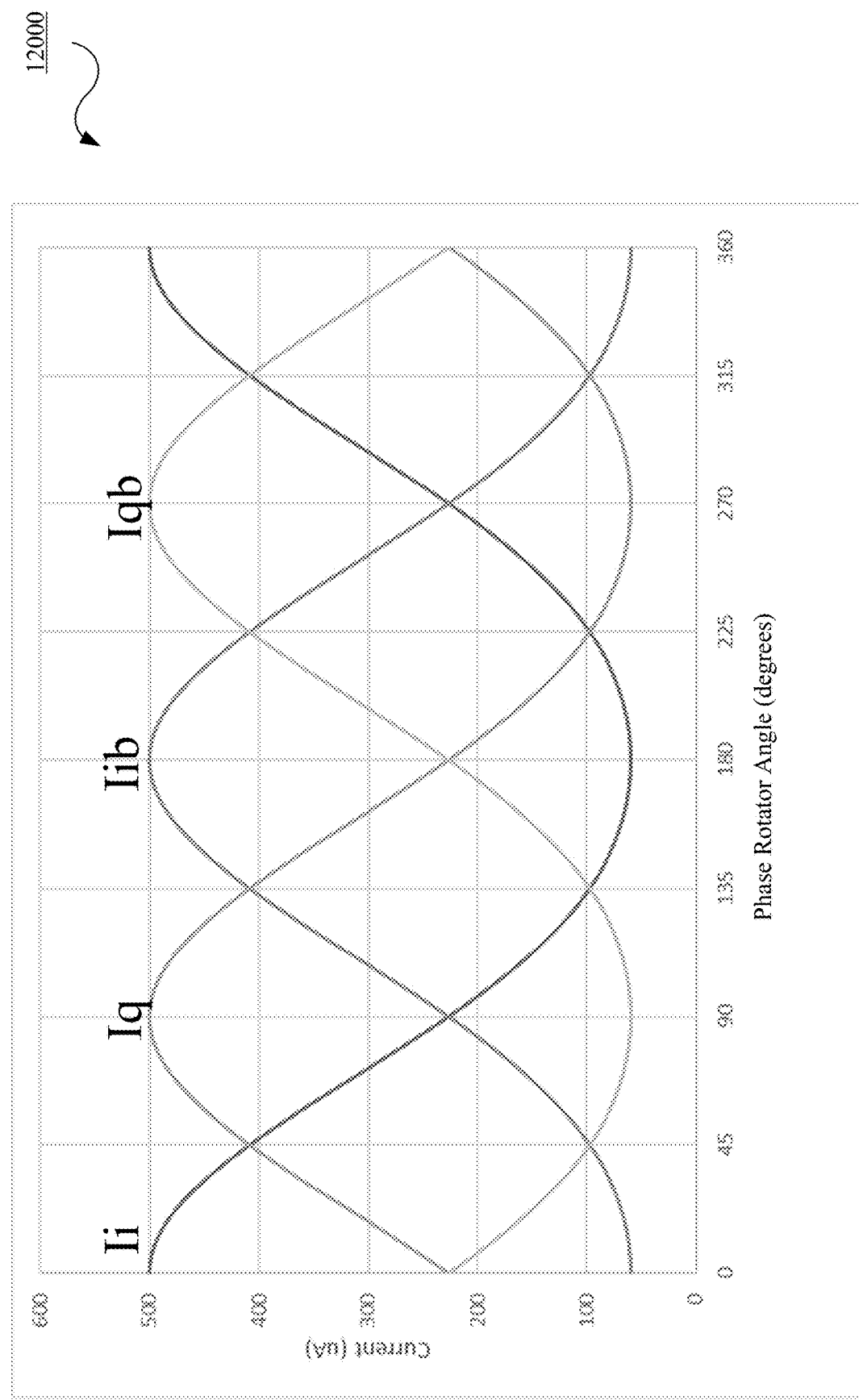
FIG. 12 is a graph of waves associated with a 4 phase differential pair circuit in accordance with embodiments of this disclosure.

This gives $$I_i=\left(\frac{\sqrt{I_{max}}+\sqrt{I_{min}}}{2}+\frac{\sqrt{I_{max}}-\sqrt{I_{min}}}{2}\cos\varphi\right)^2 \quad \text{Equation (11)}$$

$$I_{ib}=\left(\frac{\sqrt{I_{max}}+\sqrt{I_{min}}}{2}-\frac{\sqrt{I_{max}}-\sqrt{I_{min}}}{2}\cos\varphi\right)^2= \quad \text{Equation (12)}$$
$$\left(\frac{\sqrt{I_{max}}+\sqrt{I_{min}}}{2}+\frac{\sqrt{I_{max}}-\sqrt{I_{min}}}{2}\cos(\varphi+\pi)\right)^2$$

$$I_q=\left(\frac{\sqrt{I_{max}}+\sqrt{I_{min}}}{2}+\frac{\sqrt{I_{max}}-\sqrt{I_{min}}}{2}\sin\varphi\right)^2= \quad \text{Equation (13)}$$
$$\left(\frac{\sqrt{I_{max}}+\sqrt{I_{min}}}{2}+\frac{\sqrt{I_{max}}-\sqrt{I_{min}}}{2}\cos\left(\varphi+\frac{\pi}{2}\right)\right)^2$$

$$I_{qb}=\left(\frac{\sqrt{I_{max}}+\sqrt{I_{min}}}{2}-\frac{\sqrt{I_{max}}-\sqrt{I_{min}}}{2}\sin\varphi\right)^2= \quad \text{Equation (14)}$$
$$\left(\frac{\sqrt{I_{max}}+\sqrt{I_{min}}}{2}+\frac{\sqrt{I_{max}}-\sqrt{I_{min}}}{2}\cos\left(\varphi+\frac{3}{4}\pi\right)\right)^2$$

where Equations (11) through (14) are representative of the curves shown in FIG. 12 to stay within a linear region of operation.

Alternatively, for a low power current value derivation, the equations are:

$$I_{out}=g_{mI}v_{inI}+g_{mIb}v_{inIb}+g_{mQ}v_{inQ}+g_{mQb}v_{inQb}$$

$$=g_{mI}B\sin\omega t - g_{mIb}B\sin\omega t + g_{mQ}B\cos\omega t - g_{mQb}B\cos\omega t$$

$$=C\sin\omega t(\sqrt{I_i}-\sqrt{I_{ib}})+C\cos\omega t(\sqrt{I_i}-\sqrt{I_{ib}})=A\cos\varphi\sin\omega t + A\sin\varphi\cos\omega t \quad \text{Equation (15)}$$

This gives:

$$\cos\varphi=k(\sqrt{I_i}-\sqrt{I_{ib}}) \text{ and } \sin\varphi=k(\sqrt{I_q}-\sqrt{I_{qb}}) \quad \text{Equation (16)}$$

Figure 13:
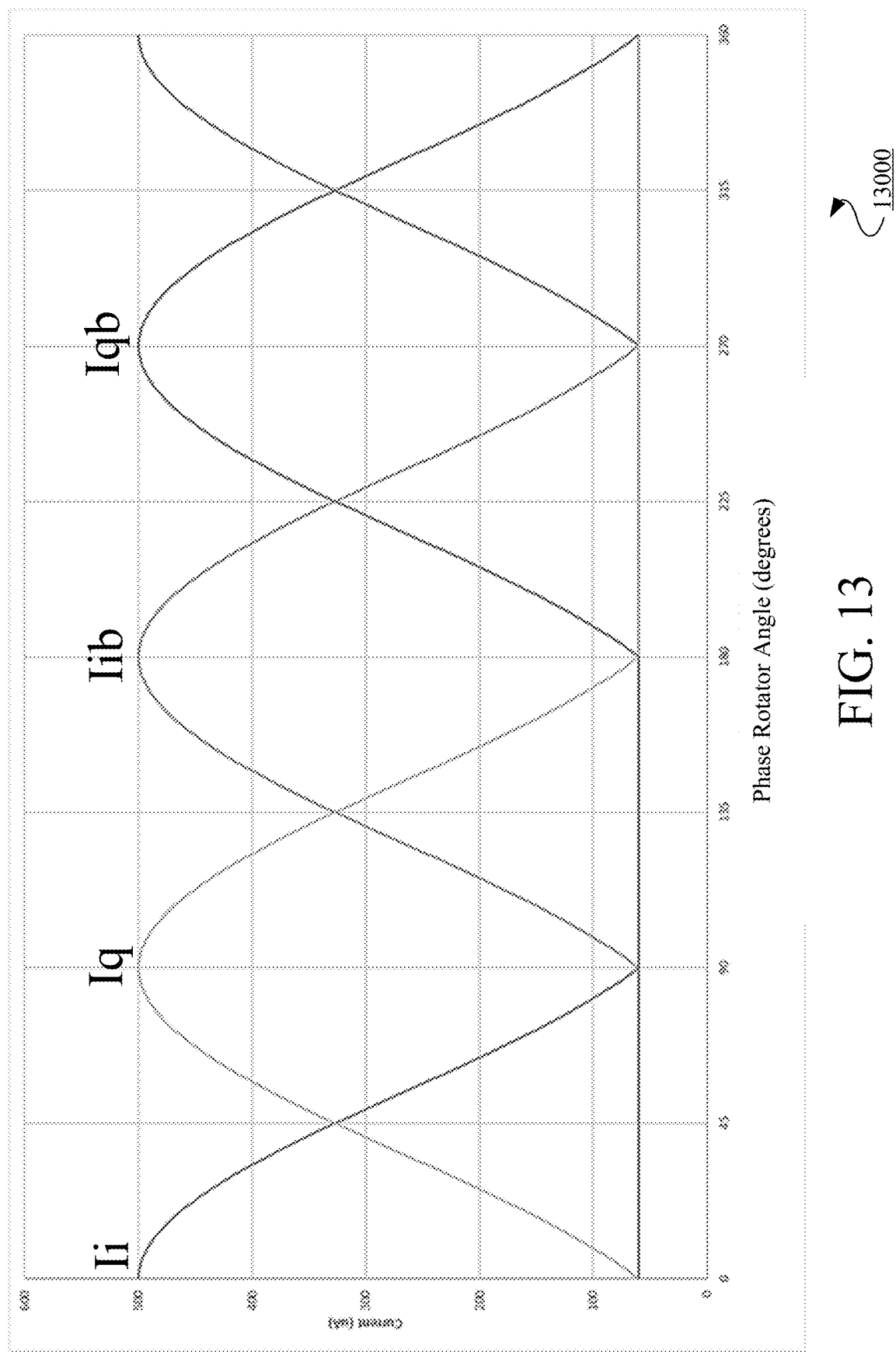
FIG. 13 is a graph of waves associated with a 4 phase differential pair circuit in accordance with embodiments of this disclosure.

Constraint either $\sqrt{I_i}$ or $\sqrt{I_{ib}}$ and either $\sqrt{I_q}$ or $\sqrt{I_{qb}}$ to be $I_{min}$ at any given time, with peak value at $I_{max}$. This gives:

$$I_i=(\alpha\cos\varphi+\sqrt{I_{min}})^2 \text{ for } \varphi\in(-\pi,\pi), I_{min} \text{ elsewhere with } \alpha=\sqrt{I_{max}}-\sqrt{I_{min}} \quad \text{Equation (17)}$$

$$I_{ib}=(-\alpha\cos\varphi+\sqrt{I_{min}})^2 \text{ for } \varphi\in(\pi,2\pi), I_{min} \text{ elsewhere with } \alpha=\sqrt{I_{max}}-\sqrt{I_{min}} \quad \text{Equation (18)}$$

$$I_q=(\alpha\sin\varphi+\sqrt{I_{min}})^2 \text{ for } \varphi\in(-\pi,\pi), I_{min} \text{ elsewhere with } \alpha=\sqrt{I_{max}}-\sqrt{I_{min}} \quad \text{Equation (19)}$$

$$I_{qb}=(-\alpha\sin\varphi+\sqrt{I_{min}})^2 \text{ for } \varphi\in(-\pi,\pi), I_{min} \text{ elsewhere with } \alpha=\sqrt{I_{max}}-\sqrt{I_{min}} \quad \text{Equation (20)}$$

where Equations (17) through (20) are representative of the curves shown in FIG. 13 to stay within a linear region of operation.

Figure 14:
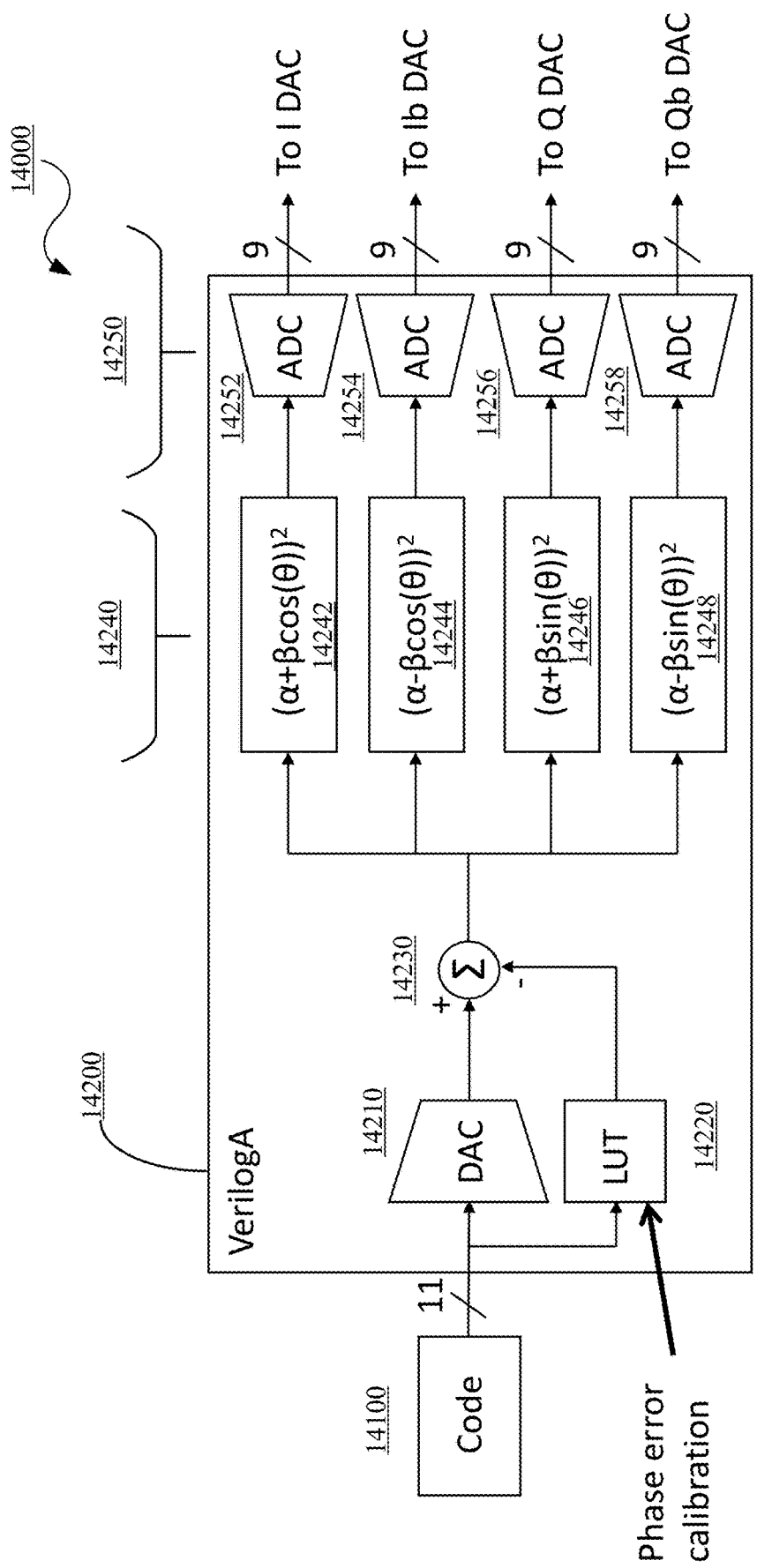
FIG. 14 is a block diagram of a system model with a code generation circuit for a highly linear phase rotator circuit in accordance with embodiments of this disclosure.

FIG. 14 is a block diagram of a system model 14000 including a code generation block for a highly linear phase rotator circuit in accordance with embodiments of this disclosure. The code generation block can be implemented in the systems and circuits described herein, for example, as shown in FIGS. 3-8. The system 14000 includes a master code generation block 14100 connected to a code generation block 14200. The code generation block 14200 can include a DAC 14210 and a look-up table (LUT) 14220 connected to a summer 14230. The summer 14230 is connected to a current constraint code block 14240, which in turn is connected to an ADC block 14250. The constraint code block 14240 can include current constraint code blocks 14242, 14244, 14246, and 14248 and the ADC block 14250 can include ADCs 14252, 14254, 14256, and 14258.

As described herein, the current constraint code block 14240 and the current constraint code blocks 14242, 14244, 14246, and 14248 can be set to maintain device operation in a linear region of operation. The LUT 14220 can be set to calibrate a device for non-linearities due to inherent phase rotator non-linearity, I-Q mismatch with respect to phase, gain, or both, path mismatches between the I/Ib and Q/Qb differential pairs input and phase rotator output.

Operationally, the master code generation block 14100 can generate a master code representative of the phase rotation needed to account for a frequency offset relative to a channel frequency. In implementations, the master code is a 11 bit code. The DAC 14210 can convert the master code and the LUT 14220 can apply calibration to the master code. The outputs of the DAC 14210 and the LUT 14220 can be summed to generate a calibrated code. The current constraint code blocks 14242, 14244, 14246, and 14248 are associated with different phase quadrants and can adjust the calibrated code to stay within a region of operation associated with substantially linear or highly linear operation of a phase rotator device. The ADCs 14252, 14254, 14256, and 14258 can convert the output of the current constraint code blocks 14242, 14244, 14246, and 14248 to phase offset codes for each phase quadrant. In implementations, the phase offset codes are 9 bits. The phase offset codes can be applied at current DACs associated with each of the phase quadrants. In implementations, the number of phase quadrants can be increased using Π/2 shifts.

Figure 15:
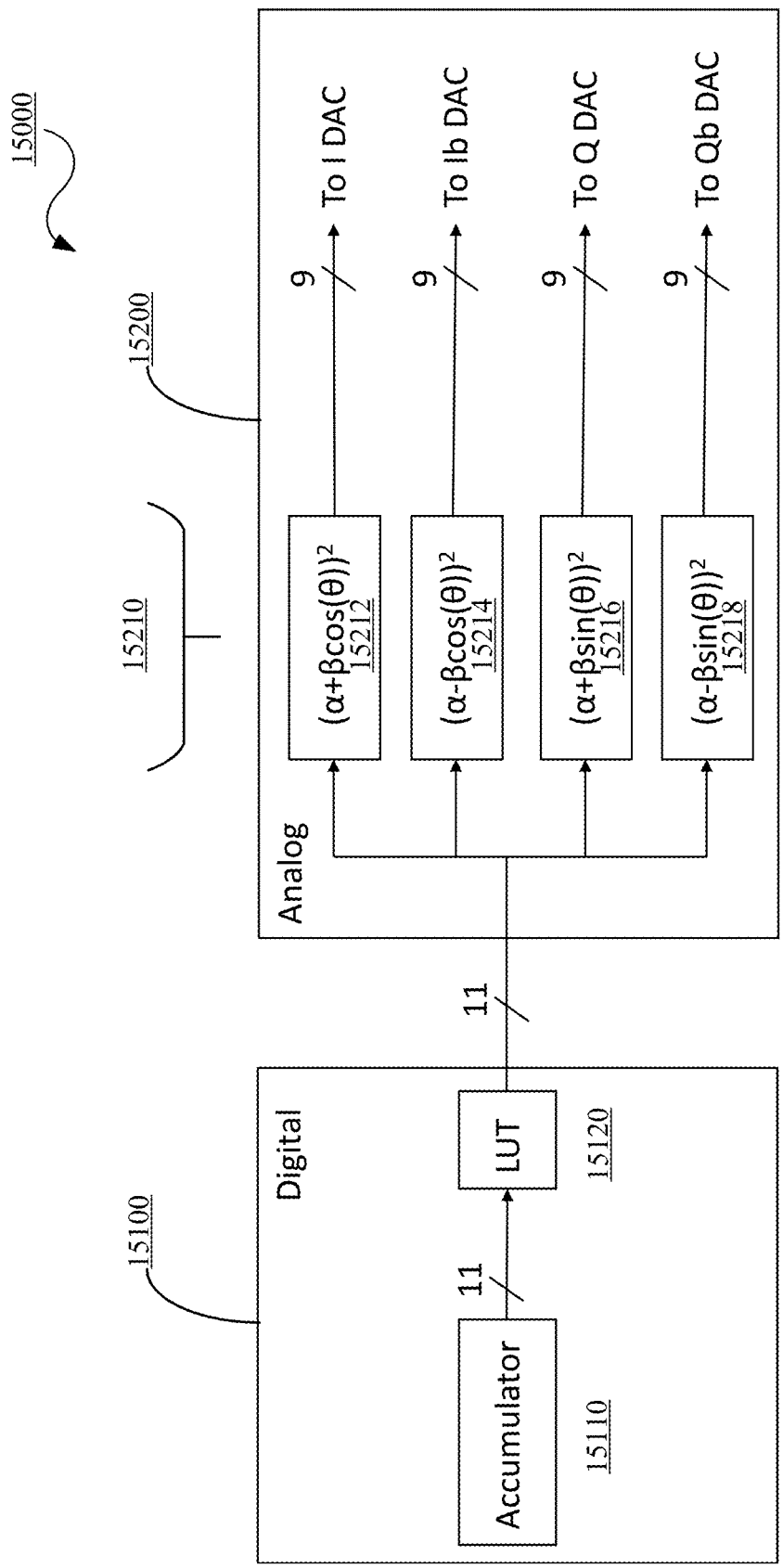
FIG. 15 is a block diagram of a code generation circuit for a highly linear phase rotator circuit in accordance with embodiments of this disclosure.

FIG. 15 is a block diagram of a code generation circuit 15000 for a highly linear phase rotator circuit in accordance with embodiments of this disclosure. The code generation circuit can be implemented in the systems and circuits described herein, for example, as shown in FIGS. 3-8. The code generation circuit 15000 includes a digital implementation section 15100 connected to an analog implementation section 15200. The digital section implementation 15100 includes an accumulator 15110 connected to a LUT 15120. In implementations, the LUT 15120 can be used to implement correction for both residual non-linearity and calibration, where calibration can be done by comparing a feedback path without a phase rotator and a clock path with a phase rotator. The analog implementation section 15200 includes a current constraint block 15210 which includes current constraint blocks 15212, 15214, 15216, and 15218. As described herein, the current constraint code block 15210 can be set to maintain device operation in a linear region of operation. The LUT 15120 can be set to calibrate a device for non-linearities due to inherent phase rotator non-linearity, I-Q mismatch with respect to phase, gain, or both, path mismatches between the I/Ib and Q/Qb differential pairs input and phase rotator output.

Operationally, the accumulator 15110 can provide a master code representative of the phase rotation needed to account for a frequency offset relative to a channel frequency. In implementations, the master code is a 11 bit code. The LUT 15120 can apply calibration to the master code to generate a calibrated code. The current constraint code blocks 15212, 15214, 15216, and 15218 are associated with different phase quadrants and can adjust the calibrated code to stay within a region of operation associated with substantially linear or highly linear operation of a phase rotator device. The outputs of the current constraint code blocks 15212, 15214, 15216, and 15218 are phase offset codes for each phase quadrant. In implementations, the phase offset codes are 9 bits. The phase offset codes can be applied at current DACs associated with each of the phase quadrants. In implementations, the number of phase quadrants can be increased using Π/2 shifts.

Figures 16A, 16B:
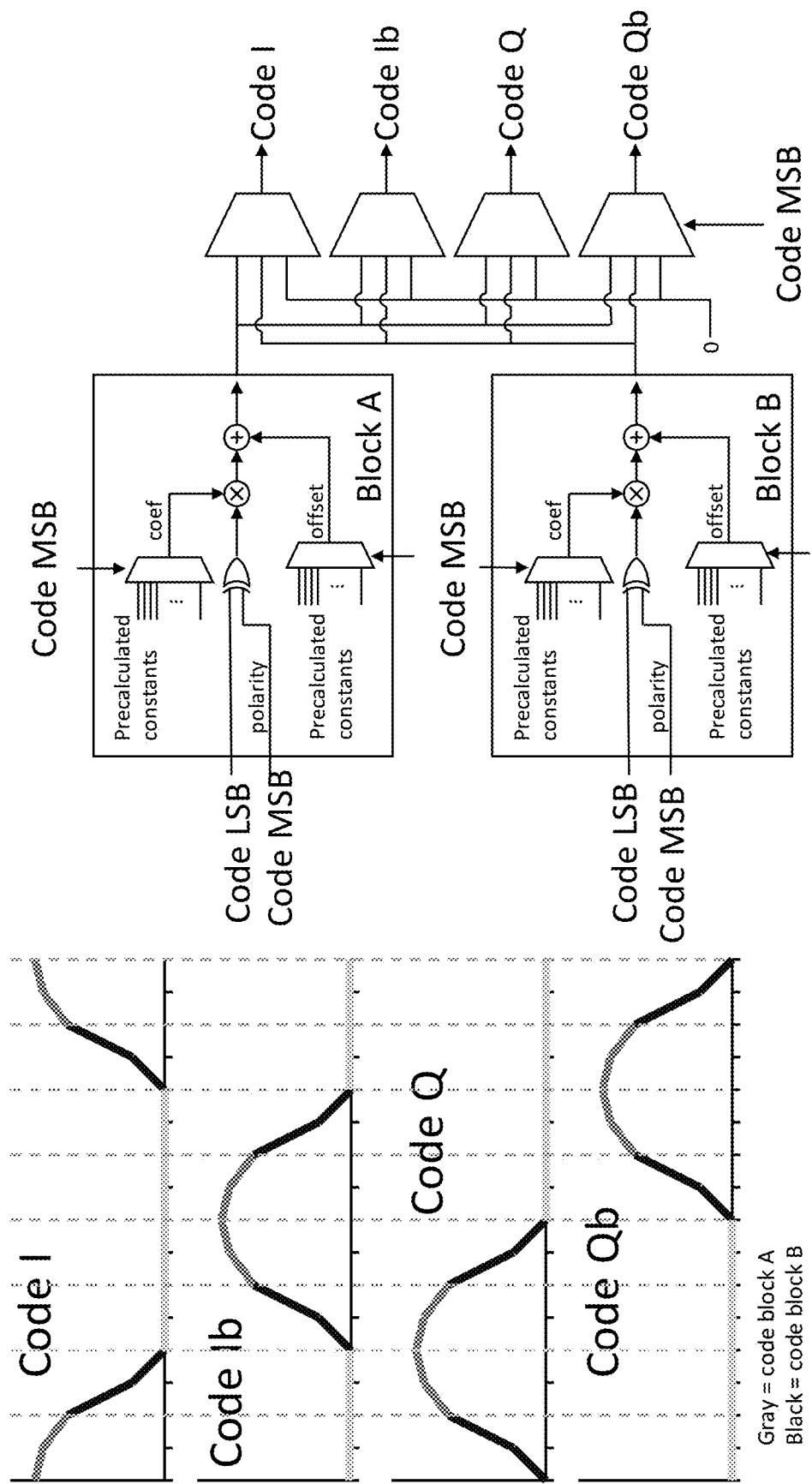
FIG. 16A is a block diagram of an analog code block 16000 for a highly linear phase rotator circuit and 16B is a block diagram of an analog code scheme in accordance with embodiments of this disclosure.

FIG. 16A is a block diagram of an analog code generation block 16000 for a highly linear phase rotator circuit and 16B is a block diagram of an analog code scheme 16500 in accordance with embodiments of this disclosure. The analog code generation block can be implemented in the systems and circuits described herein, for example, as shown in FIGS. 3-8 and 15. The analog code generation block 16000 reduces the amount of circuitry by using the analog code scheme 16500 to determine each of the codes for each of the phase quadrants. The analog code generation block 16000 can include a block A circuit 16100 and a block B circuit 16200 which uses the analog code scheme 16500 to generate the codes. The analog code scheme 16500 is a piece-wise linear functional representation to account for non-linear properties of the phase rotators. The block A circuit 16100 and the block B circuit 16200 are connected to multiplexors 16300. The multiplexors 16300 can include multiplexors 16310, 16320, 16330, and 16340 which are each three input multiplexors with one input connected to zero. The multiplexors 16310, 16320, 16330, and 16340 correspond to the phase quadrants.

The analog code scheme 16500 uses the most significant bits (MSB) and the least significant bits (LSB) of the master code to implement a piecewise linear code response with arbitrary slopes and offsets. The MSB or upper bits control the multiplexors and switches and control which path is used for the LSB or lower bits. As a result, codes are generated by multiplying the LSB with a constant and adding another fixed constant to them, with the MSB or upper bits controlling which constants are used to multiply and add.

The block A circuit 16100 can include a multiplexor 16110 and an exclusive OR (XOR) gate 16120 connected to a multiplier 16130. The inputs to the multiplexor 16110 are connected to precalculated constants and uses the MSBs of the master code as the selection control to select the coefficients for the multiplier 16130. The XOR gate 16120 determines the polarity of the shift based on the MSB and LSB of the master code. The multiplier 16130 can be connected to a summer 16140, which is also connected to a multiplexor 16150. The inputs to the multiplexor 16110 are connected to precalculated constants and uses the MSB of the master code as the selection control to determine an offset input to the summer 16140. The output of the summer 16140 is connected to one input of each of the multiplexors 16310, 16320, 16330, and 16340.

The block B circuit 16200 can include a multiplexor 16210 and an XOR gate 16220 connected to a multiplier 16230. The inputs to the multiplexor 16210 are connected to precalculated constants and uses the MSB of the master code as the selection control to select the coefficients for the multiplier 16230. The XOR gate 16220 determines the polarity of the shift based on the MSB and the LSB of the master code. The multiplier 16230 can be connected to a summer 16240, which is also connected to a multiplexor 16250. The inputs to the multiplexor 16210 are connected to precalculated constants and uses the MSB of the master code as the selection control to determine an offset input to the summer 16240. The output of the summer 16240 is connected to another input of each of the multiplexors 16310, 16320, 16330, and 16340.

Figure 17:
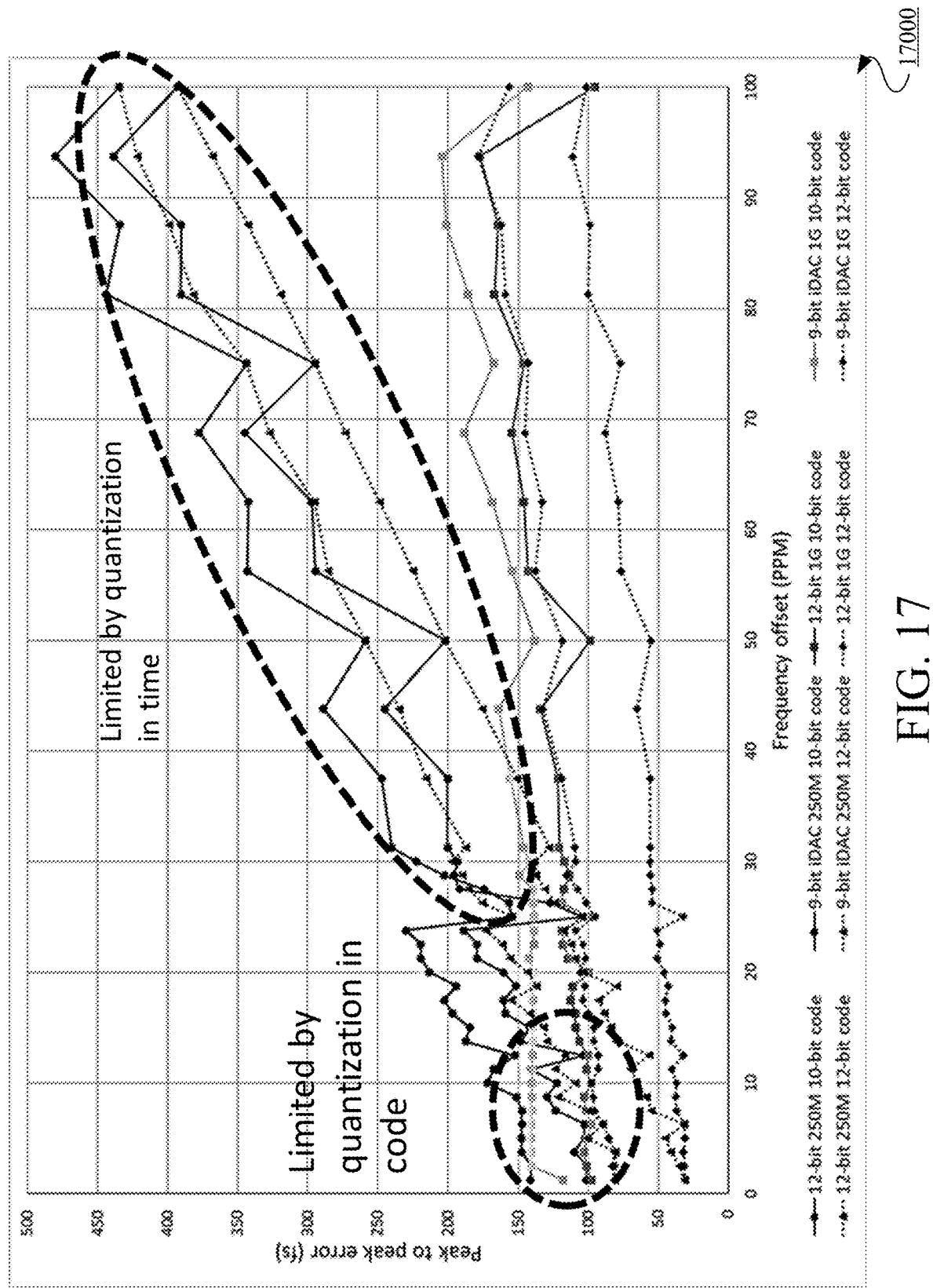
FIG. 17 is a graph comparing different code bit lengths, strobe rates, and operating clocks.

FIG. 17 is a graph 17000 comparing different code bit lengths, strobe rates, and operating clocks. The graph 17000 shows peak-to-peak error (fs) versus frequency offset (PPM). In general, increased code length can increase minimum resolution and linearity. Most combinations of code bit lengths, strobe rates, and operating clocks are limited in quantization at smaller frequency offsets due to code length. A number of combinations of code bit lengths, strobe rates, and operating clocks are limited in quantization at higher frequency offsets due to time.

Figure 18:
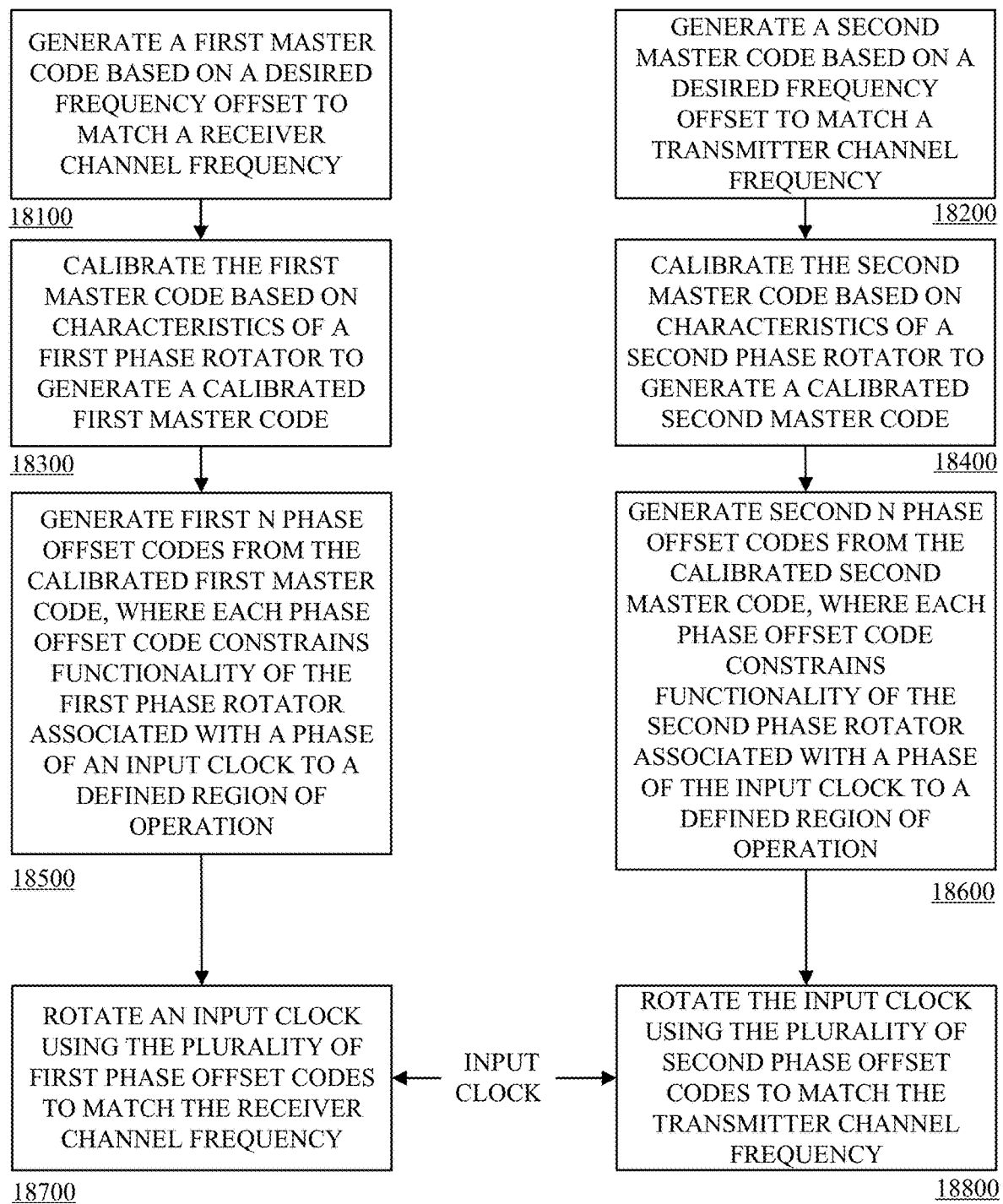
FIG. 18 is a flowchart of an example technique for clock generation using highly linear dual phase rotators in accordance with embodiments of this disclosure.

FIG. 18 is a flowchart of an example method 18000 for clock generation using highly linear phase rotators in accordance with embodiments of this disclosure. The method 18000 includes: generating 18100 a first master code based on a desired frequency offset to match a receiver channel frequency; generating 18200 a second master code based on a desired frequency offset to match a transmitter channel frequency; calibrating 18300 the first master code based on characteristics of a first phase rotator to generate a calibrated first master code; calibrating 18400 the second master code based on characteristics of a second phase rotator to generate a calibrated second master code; generating 18500 first N phase offset codes from the calibrated first master code, where each phase offset code constrains functionality of the first phase rotator associated with a phase of the input clock to a defined region of operation; generating 18600 second N phase offset codes from the calibrated second master code, where each phase offset code constrains functionality of the second phase rotator associated with a phase of the input clock to a defined region of operation; rotating 18700 the input clock using the first N phase offset codes to match the receiver channel frequency; and rotating 18800 the input clock using the second N phase offset codes to match the transmitter channel frequency. The method 18000 can be implemented by the system 4000 of FIG. 4, the clock generation circuit 5000 of FIG. 5, the system 6000 of FIG. 6, the circuit 7000 of FIG. 7, the circuit 8000 of FIG. 8, the circuit 15000 of FIG. 15, the analog code block 16000 of FIG. 16A, and the analog code scheme 16500 of FIG. 16B, as appropriate and applicable.

The method 18000 includes generating 18100 a first master code based on a desired frequency offset to match a receiver channel frequency. A receiver on a first card, system, or device (collectively "entity") communicates with a transmitter on a second entity over a channel using a designated channel frequency (receiver channel frequency). Consequently, a frequency of the clock on the first entity has to be aligned to the receiver channel frequency to permit communication between the first entity receiver and the second entity transmitter. This can be done using a highly linear continuous rotation phase rotator. The first entity determines the required frequency offset and generates a first master code, first master phase offset code, or receiver master code (collectively "first master code"). The frequency offset is implemented using a first highly linear continuous rotation phase rotator.

The method 18000 includes generating 18200 a second master code based on a desired frequency offset to match a transmitter channel frequency. A transmitter on the first entity communicates with a receiver on a third entity over a channel using a designated channel frequency (transmitter channel frequency). Consequently, a frequency of the clock on the first entity has to be aligned to the transmitter channel frequency to permit communication between the first entity transmitter and the third entity receiver. The first entity determines the required frequency offset and generates a second master code, second master phase offset code, or a transmitter master code (collectively "second master code"). The frequency offset is implemented using a second highly linear continuous rotation phase rotator.

The method 18000 includes calibrating 18300 the first master code based on characteristics of a first phase rotator to generate a calibrated first master code. Calibration measurements of the first phase rotator are done to obtain calibration characteristics. These calibration characteristics are stored in a look-up table (LUT) to implement correction for residual non-linearities and calibration. The calibration characteristics are applied to the first master code.

The method 18000 includes calibrating 18400 the second master code based on characteristics of a second phase rotator to generate a calibrated second master code. Calibration measurements of the first second rotator are done to obtain calibration characteristics. These calibration characteristics are stored in a look-up table (LUT) to implement correction for residual non-linearities and calibration. The calibration characteristics are applied to the second master code.

The method 18000 includes generating 18500 first N phase offset codes from the calibrated first master code, where each phase offset code constrains functionality of the first phase rotator associated with a phase of the input clock to a defined region of operation. The first phase rotator is segmented into N segments. Each segment individually processes one phase of N phases of an input clock. Each segment includes a differential pair which has different operating characteristics depending on bias current levels, for example. A particular region of operation provides near or substantially near operating characteristics (referred herein as a highly linear phase rotator). The parameters or constants to maintain operability in this region of operation for each differential pair in each segment are applied to the calibrated first master code to generate the phase offset code for that segment.

The method 18000 includes generating 18600 second N phase offset codes from the calibrated second master code, where each phase offset code constrains functionality of the second phase rotator associated with a phase of the input clock to a defined region of operation. The second phase rotator is segmented into N segments. Each segment individually processes one phase of N phases of an input clock. Each segment includes a differential pair which has different operating characteristics depending on bias current levels, for example. A particular region of operation provides near or substantially near operating characteristics (referred herein as a highly linear phase rotator). The parameters or constants to maintain operability in this region of operation for each differential pair in each segment are applied to the calibrated second master code to generate the phase offset code for that segment.

The method 18000 includes rotating 18700 the input clock using the first N phase offset codes to match the receiver channel frequency. Each of the first N phase offset codes are applied to generate a bias current for each segment, respectively. Each bias current acts as a weight with respect to an associated phase of the input clock. The collective output of the segments results in offsetting the frequency of the input clock to the receiver channel frequency. The input clock is provided by a single phase locked loop to the first phase rotator and the second phase rotator.

The method 18000 includes rotating 18800 the input clock using the second N phase offset codes to match the transmitter channel frequency. Each of the second N phase offset codes are applied to generate a bias current for each segment, respectively. Each bias current acts as a weight with respect to an associated phase of the input clock. The collective output of the segments results in offsetting the frequency of the input clock to the transmitter channel frequency.

Although some embodiments herein refer to methods, it will be appreciated by one skilled in the art that they may also be embodied as a system or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "processor," "device," or "system." Furthermore, aspects of the present invention may take the form of a computer program product embodied in one or more the computer readable mediums having the computer readable program code embodied thereon. Any combination of one or more computer readable mediums may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to CDs, DVDs, wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions.

These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowcharts and block diagrams in the figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures.

While the disclosure has been described in connection with certain embodiments, it is to be understood that the disclosure is not to be limited to the disclosed embodiments but, on the contrary, is intended to cover various modifications, combinations, and equivalent arrangements included within the scope of the appended claims, which scope is to be accorded the broadest interpretation so as to encompass all such modifications and equivalent structures as is permitted under the law.

What is claimed is:

1. A clock generation circuit comprising:
a single phase locked loop configured to generate a clock;
a receiver clock generation circuit connected to the phase locked loop, the receiver clock generation circuit comprises
a receiver phase rotator having N phase segments with N receiver phase offset codes corresponding to N phases of the clock, the receiver phase rotator configured to rotate the clock using the N receiver phase offset codes to output a receiver clock which matches a receiver channel frequency; and
a transmitter clock generation circuit connected to the phase locked loop, the transmitter clock generation circuit comprises
a transmitter phase rotator having N phase segments with N transmitter phase offset codes corresponding to N phases of the clock, the transmitter phase rotator configured to rotate the clock using the N transmitter phase offset codes to output a transmitter clock which matches a transmitter channel frequency,
wherein each of the receiver phase rotator and the transmitter phase rotator are configured to provide continuous rotation of the clock to track the receiver channel frequency and the transmitter channel frequency, respectively.

2. The clock generation circuit of claim 1, wherein each phase segment of the receiver phase rotator and each phase segment the transmitter phase rotator further comprise a differential pair, wherein N receiver differential pairs link the N phases of the clock to the receiver clock and wherein N transmitter differential pairs link the N phases of the clock to the transmitter clock.

3. The clock generation circuit of claim 1, wherein each phase segment of the receiver phase rotator has a receiver differential pair which is connected to an associated non-differential current source and each phase segment of the transmitter phase rotator has a transmitter differential pair which is connected to an associated non-differential current source.

4. The clock generation circuit of claim 1, further comprises
- a receiver code generation circuit configured to apply receiver phase rotator calibration corrections to a receiver master code associated with a determined frequency offset and generate the N receiver phase offset codes from the receiver master code, wherein each receiver phase offset code constrains receiver phase rotator functionality associated with a phase segment to a defined region of operation; and
- a transmitter code generation circuit configured to apply transmitter phase rotator calibration corrections to a transmitter master code associated with a determined frequency offset and generate the N transmitter phase offset codes from the transmitter master code, wherein each transmitter phase offset code constrains transmitter phase rotator functionality associated with a phase segment to a defined region of operation.

5. The clock generation circuit of claim 4, wherein each of the receiver phase rotator calibration corrections and the transmitter phase rotator calibration corrections correct inherent phase rotator non-linearity, phase mismatch between the N phases, gain mismatch between the N phases, path mismatches between phase pairs, and path mismatches at a receiver clock output or a transmitter clock output, respectively.

6. The clock generation circuit of claim 4, wherein the receiver phase rotator and the transmitter phase rotator each comprise
- a current digital-to-analog (DAC) configured to provide a bias current compensated by the receiver code generation circuit;
- a two level current mirror connected to the current DAC;
- a differential pair connected to the two level current mirror via a resistive degeneration circuit and having gates connected to a phase pair; and
- a cascade stage connected to an output of the differential pair.

7. The clock generation circuit of claim 4, wherein the receiver code generation circuit and the transmitter code generation circuit each compensate for arctan effect of a theoretically perfect differential pair and differential pair non-linearities.

8. The clock generation circuit of claim 4, wherein the receiver code generation circuit and the transmitter code generation circuit each maintain each of the N phase segments of the receiver phase rotator and the transmitter phase rotator, respectively, with a minimum current to smooth segment transition boundaries.

9. The clock generation circuit of claim 4, wherein each of the receiver code generation circuit and the transmitter code generation circuit comprise
- a first code circuit configured to apply one set of differential pair parameters based on most significant bits and least significant bits of a master code;
- a second code circuit configured to apply another set of differential pair parameters based on the most significant bits and the least significant bits of the master code; and
- N multiplexors connected to the first code circuit and the second code circuit, the N multiplexors configured to output N phase offset codes.

10. The clock generation circuit of claim 9, wherein each of the receiver code generation circuit and the transmitter code generation circuit comprise a look-up table to apply receiver phase rotator calibration corrections and transmitter phase rotator calibration corrections, respectively.

11. A method for generating clocks, the method comprising:
- generating first N phase offset codes from a calibrated first master code, wherein each phase offset code constrains functionality of a first phase rotator associated with a phase of an input clock to a defined region of operation and maintains the first phase rotator associated with a phase of the input clock at a minimum current to smooth transition between phase boundaries;
- generating second N phase offset codes from a calibrated second master code, wherein each phase offset code constrains functionality of a second phase rotator associated with a phase of the input clock to a defined region of operation and maintains the second phase rotator associated with a phase of the input clock at a minimum current to smooth transition between phase boundaries;
- rotating the input clock using the first N phase offset codes to match the first channel frequency; and
- rotating the input clock using the second N phase offset codes to match the second channel frequency,
- wherein each of the first phase rotator and the second phase rotator are configured to provide continuous rotation of the input clock to track the first channel frequency and the second channel frequency, respectively.

12. The method of claim 11, the method further comprises
- generating a first master code based on a desired frequency offset to match the first channel frequency;
- generating a second master code based on a desired frequency offset to match the second channel frequency;
- calibrating the first master code based on the characteristics of the first phase rotator to generate the calibrated first master code; and
- calibrating the second master code based on the characteristics of the second phase rotator to generate the calibrated second master code.

13. The method of claim 12, wherein the calibrating the first master code and the calibrating the second master code each further comprise using a look-up table to correct inherent phase rotator non-linearity, phase mismatch between the N phases, gain mismatch between the N phases, path mismatches between phase pairs, and path mismatches at an output.

14. The method of claim 12, wherein the generating first N phase offset codes further comprises applying one set of differential pair parameters based on most significant bits and least significant bits of the first master code to generate a first first output, applying another set of differential pair parameters based on the most significant bits and the least significant bits of the first master code to generate a first second output, and outputting the first N phase offset codes by multiplexing the first output and the second output, and wherein the generating second N phase offset codes further comprises applying one set of differential pair parameters based on most significant bits and least significant bits of the second master code to generate a second first output, applying another set of differential pair parameters based on the most significant bits and the least significant bits of the second master code to generate a second second output, and outputting the first N phase offset codes by multiplexing the second first output and the second second output.

15. The method of claim 11, wherein the generating first N phase offset codes and the generating second N phase offset codes each compensate for arctan effects of a theoretically perfect differential pair and differential pair non-linearities.

16. A phase rotator comprising:
N input clock phase segments, each input clock phase segment comprising
  a current digital-to-analog (DAC) configured to provide a bias current based on a phase offset code compensated for non-linearities associated with the respective input clock phase segment and set to maintain a minimum current to smooth transitions between the N input clock phase segments;
  a two level current mirror connected to the current DAC;
  a differential pair connected to the two level current mirror via a resistive degeneration circuit and having gates connected to a phase pair of an input clock; and
  a cascade stage connected to an output of the differential pair.

17. The phase rotator of claim 16, wherein the phase rotator provides continuous rotation of the input clock to track the channel frequency.

18. The phase rotator of claim 16, wherein each phase offset code constrains functionality of a respective differential pair to a defined region of operation.

19. The phase rotator of claim 16, wherein each phase offset code compensates for arctan effect of a theoretically perfect differential pair and differential pair non-linearities with respect to the input clock phase segment.

* * * * *